(12) United States Patent
Shimada et al.

(10) Patent No.: US 6,255,034 B1
(45) Date of Patent: Jul. 3, 2001

(54) RADIATION SENSITIVE COMPOSITION

(75) Inventors: Satoshi Shimada; Tomio Nagatsuka; Hiroaki Nemoto; Atsushi Kumano, all of Mie (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/149,095

(22) Filed: Sep. 8, 1998

(30) Foreign Application Priority Data

Sep. 9, 1997 (JP) ................................................. 9-259386
Nov. 18, 1997 (JP) ................................................. 9-332316

(51) Int. Cl.$^7$ .............................. G03F 7/027; G03C 1/73
(52) U.S. Cl. ................................... 430/281.1; 430/283.1; 430/905; 430/913; 430/918; 430/920
(58) Field of Search ............................. 430/281.1, 283.1, 430/905, 913, 918, 920

(56) References Cited

U.S. PATENT DOCUMENTS

| | | |
|---|---|---|
| 4,764,452 | 8/1988 | Ohno . |
| 4,789,620 | 12/1988 | Sasaki et al. . |
| 5,223,495 * | 6/1993 | Inoue et al. ............................ 524/188 |
| 5,622,813 * | 4/1997 | Kanda et al. ...................... 430/281.1 |
| 5,866,298 * | 2/1999 | Iwamoto et al. .................. 430/281.1 |
| 6,013,415 * | 1/2000 | Sakurai et al. .................... 430/281.1 |
| 6,087,050 * | 7/2000 | Itano et al. ................................ 430/7 |

FOREIGN PATENT DOCUMENTS

| | | |
|---|---|---|
| 0 062 610 | 10/1982 | (EP) . |
| 0 337 403 | 10/1989 | (EP) . |
| 1 123 103 | 8/1968 | (GB) . |
| 8-259876 | 10/1996 | (JP) . |
| 10274848 * | 10/1998 | (JP) . |

OTHER PUBLICATIONS

Japan Patent JP 111349842 (abstract); Kiyohara et al. (Dec. 21, 1999); Photopolymerizable dispersants for pigments and photoresist and light–blocking compositions containing them.*

Japanese Patent No. 406145458A, abstract; Fujii et al. "NonAqueouse Resin Solution", May 24, 1994.*

* cited by examiner

*Primary Examiner*—Janet Baxter
*Assistant Examiner*—Yvette M. Clarke
(74) *Attorney, Agent, or Firm*—Oblon, Spivak, McClelland, Maier & Neustadt, P.C.

(57) ABSTRACT

A radiation sensitive composition contains (A) a colorant, (B) a binder polymer, (C) a polyfunctional monomer and (D) a carboxyl group-containing monofunctional monomer, an amide group-containing monoethylenically unsaturated monomer, a monoethylenically unsaturated monomer having a cyclic amide group or cyclic imide group or a phenyl group-containing (meth)acrylate, and (E) a photopolymerization initiator.

The composition is useful for producing a color filter for use in color liquid crystal display device, color image pick-up elements etc.

14 Claims, No Drawings

RADIATION SENSITIVE COMPOSITION

DETAILED DESCRIPTION OF THE INVENTION

The present invention relates to a radiation sensitive composition comprising a colorant. More specifically, it relates to a radiation sensitive composition which is advantageously used for the production of a color filter for use in color liquid crystal display devices, color image pick-up elements and the like.

A radiation sensitive composition is used to form a color filter for use in color liquid crystal display devices, color image pick-up elements and the like. Since high sensitivity, adhesion to a substrate, chemical resistance and the like are required for the composition, a negative radiation sensitive composition is generally used.

In general, to form a color filter using such a negative radiation sensitive composition, a light screening layer pattern is formed on a transparent substrate, a negative radiation sensitive composition resin having a colorant dispersed therein is applied to the substrate, exposed to radiation through a photomask (to be referred to as "exposure" hereinafter) to be developed, and unexposed portions are dissolved with a developer to form a pixel pattern. Red, green and blue colorants are used as the colorant.

As the negative radiation sensitive composition having the colorant dispersed therein has been conventionally used a negative radiation sensitive composition comprising a resin containing an acidic functional group such as (meth)acrylic acid, a polyfunctional monomer such as pentaerythritol tri(meth)acrylate, and a photopolymerization initiator such as 1-hydroxycyclohexyl phenyl ketone.

However, when a color filter is to be formed from such a negative radiation sensitive composition, a pixel portion which has been cured by exposure may be swollen with an alkali developer at the time of development using the alkali developer, the resolution of the obtained pixel pattern may lower and the pixel pattern may deform. Particularly when a negative radiation sensitive composition having a colorant dispersed therein is used for electronically engineering application in which it is used to form a fine pixel array on a silicon wafer as in the case of an image pick-up element, scum may be produced on the obtained pixel pattern, the surface of the pixel pattern may be roughened, or part of the pixel array may fall off at the time of development with an alkali developer, thereby making it difficult to produce a high-resolution pixel array at a high yield. Further, the adhesion strength of the pixel pattern is lowered by development, whereby the pixel pattern detaches from the substrate when an alignment layer or transparent conductive film is formed after the formation of the pixel array.

As a solution to the above problems, there is proposed, for example, a chemically amplified negative radiation sensitive composition which comprises a red pigment, polyvinyl phenol, methylol melamine and an optical acid generating agent such as 1,1-bis(p-chlorophenyl)-2,2,2-trichloroethane. A color filter obtained by using this composition has a fine pixel pattern having sufficient adhesion strength.

However, when a fine pixel array is to be formed using this chemically amplified negative radiation sensitive composition, an undissolved product (residue) of the composition may remain in unexposed portions (non-pixel portions) or scum may be produced on pixels at the time of development with an alkali developer.

Therefore, the development of a negative radiation sensitive composition for a color filter which is free from an undissolved product (residue) of the composition remaining in an unexposed portions and scum produced on pixels even when a fine pixel array is formed and can form a pixel array having high resolution and excellent adhesion strength to a substrate has been desired.

It is an object of the present invention to provide a novel radiation sensitive composition.

It is another object of the present invention to provide a radiation sensitive composition which is free from undissolved product (residue) of the composition remaining in an unexposed portions and scum produced pixels even when a fine pixel array is formed and can form a pixel array having excellent adhesion strength to a substrate and an excellent pattern shape at a high yield.

It is still another object of the present invention to provide a radiation sensitive composition which is suitable for the production of a color filter.

The other objects and advantages of the present invention will become apparent from the following description.

According to the present invention, firstly, the above objects and advantages of the present invention can be attained by a radiation sensitive composition (may be referred to as "the first composition of the present invention" hereinafter) which comprises:

(A) a colorant;
(B) a binder polymer;
(C) a polyfunctional monomer;
(D1) at least one carboxyl group-containing monofunctional monomer selected from the group consisting of ω-carboxy-polycaprolactone mono(meth)acrylate, (meth)acrylic acid dimers and mono(2-(meth)acryloyloxyethyl)ester of dicarboxylic acid; and
(E) a photopolymerization initiator.

According to the present invention, secondly, the above objects and advantages of the present invention can be attained by a radiation sensitive composition (may be referred to as "the second composition of the present invention" hereinafter) which comprises;

(A) a colorant;
(B) a binder polymer;
(C) a polyfunctional monomer;
(D2) an amide group-containing monoethylenically unsaturated monomer; and
(E) a photopolymerization initiator.

Thirdly, the above objects and advantages of the present invention can be attained by a radiation sensitive composition (may be referred to as "the third composition of the present invention" hereinafter) which comprises:

(A) a colorant;
(B) a binder polymer;
(C) a polyfunctional monomer;
(D3) a monoethylenically unsaturated monomer having a cyclic amide group or cyclic imide group; and
(E) a photopolymerization initiator.

Fourthly, the above objects and advantages of the present invention can be attained by a radiation sensitive composition (may be referred to as "the fourth composition of the present invention" hereinafter) which comprises:

(A) a colorant;
(B) a binder polymer;
(C) a polyfunctional monomer;

(D4) at least one phenyl group-containing (meth)acrylate selected from the group consisting of compounds represented by the following formula (2):

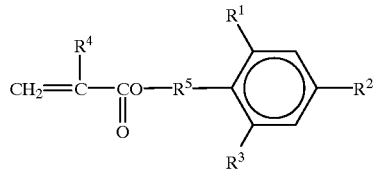
(2)

wherein $R^1$, $R^2$ and $R^3$ are independently a hydrogen atom, alkyl group having 1 to 10 carbon atoms, phenyl group, group represented by —COOR$^6$, group represented by

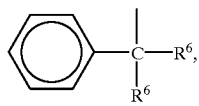

group represented by

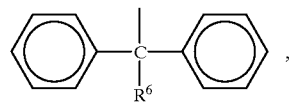

group represented by

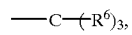

group represented by —R$^7$—H, group represented by —R$^8$, group represented by

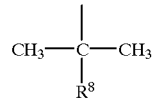

or group represented by

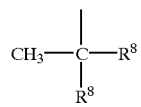

or group represented by

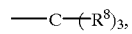

$R^4$ is a hydrogen atom or methyl group, and $R^5$ is a group represented by

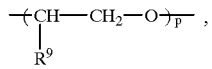

group represented by

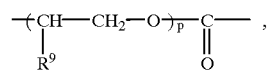

group represented by

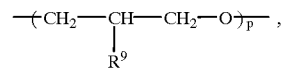

or group represented by

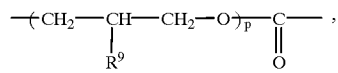

$R^6$ is a hydrogen atom or methyl group, $R^7$ is a group selected from the same groups as those represented by $R^5$, and $R^8$ is a group represented by

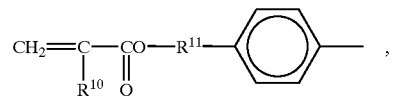

$R^9$ is a hydrogen atom, hydroxyl group or methyl group, $R^{10}$ is a hydrogen atom or methyl group and $R^{11}$ is a group selected from the same groups as those represented by $R^5$, and p is an integer of 1 to 10, and compounds represented by the following formula (3):

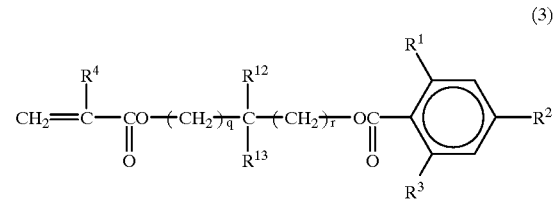
(3)

wherein $R^1$, R $R^3$ and $R^4$ are the same as defined in the above formula (2), $R^{12}$ and $R^{13}$ are independently a group represented by

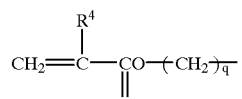

or a group selected from the same groups as those represented by $R^1$ to $R^3$ in the above formula (2), and q and r are independently an integer of 0 or 1 to 10; and (E) a photopolymerization initiator.

The present invention will be described in detail below.

The colorant (A), the binder polymer (B) and the polyfunctional monomer (C) will be described first. It should be understood that these descriptions are common to the first, second, third and fourth compositions of the present invention.

(A) Colorant

The colorant in the present invention is not limited to a particular color and is suitably selected according to the application purpose of a color filter. It may be either organic or inorganic.

Illustrative examples of the organic colorant includes dyes, organic pigments, natural coloring matters and the like. Illustrative examples of the inorganic colorant include inorganic pigments, inorganic salts called "extender pigment" and the like. Since highly accurate color development and heat resistance are required for color filters, the colorant used in the present invention preferably has high color developing properties and high heat resistance, particularly high thermal decomposition resistance. An organic colorant and/or carbon black are/is generally used, and an organic pigment and/or carbon black is/are particularly preferred.

Illustrative examples of the organic pigment include compounds classified into the group of pigments according to color index (C.I.; issued by The Society of Dyers and Colourists Co.) and having the following color index numbers, such as C.I. Pigment Yellow 12, C.I. Pigment Yellow 13, C.I. Pigment Yellow 14, C.I. Pigment Yellow 17, C.I. Pigment Yellow 20, C.I. Pigment Yellow 24, C.I. Pigment Yellow 31, C.I. Pigment Yellow 55, C.I. Pigment Yellow 83, C.I. Pigment Yellow 93, C.I. Pigment Yellow 109, C.I. Pigment Yellow 110, C.I. Pigment Yellow 138, C.I. Pigment Yellow 139, C.I. Pigment Yellow 150, C.I. Pigment Yellow 153, C.I. Pigment Yellow 154, C.I. Pigment Yellow 155, C.I. Pigment Yellow 166 and C.I. Pigment Yellow 168; C.I. Pigment Orange 36, C.I. Pigment Orange 43, C.I. Pigment Orange 51, C.I. Pigment Orange 61 and C.I. Pigment Orange 71; C.I. Pigment Red 9, C.I. Pigment Red 97, C.I. Pigment Red 122, C.I. Pigment Red 123, C.I. Pigment Red 149, C.I. Pigment Red 168, C.I. Pigment Red 176, C.I. Pigment Red 177, C.I. Pigment Red 180, C.I. Pigment Red 209, C.I. Pigment Red 215, C.I. Pigment Red 224, C.I. Pigment Red 242 and C.I. Pigment Red 254; C.I. Pigment Violet 19, C.I. Pigment Violet 23 and C.I. Pigment Violet 29; C.I. Pigment Blue 15, C.I. Pigment Blue 60, C.I. Pigment Blue 15:3, C.I. Pigment Blue 15:4 and C.I. Pigment Blue 15:6; C.I. Pigment Green 7 and C.I. Pigment Green 36; C.I. Pigment Brown 23 and C.I. Pigment Brown 25; and C.I. Pigment Black 1 and C.I. Pigment Black 7. All of these organic pigments can be preferably used.

Illustrative examples of the inorganic colorant include titanium oxide, barium sulfate, zinc oxide, lead sulfate, yellow lead, zinc yellow, red iron oxide (III), cadmium red, ultramarine blue, Prussian blue, chromium oxide green, cobalt green, amber, titanium black, synthetic iron black, carbon black and the like.

Of these inorganic colorants, carbon black is particularly preferred.

In the present invention, the above colorants may be used alone or in admixture of two or more.

The surface of each of these colorants may be modified with a polymer before use. The polymer for modifying the surface of the colorant is a polymer disclosed by JP-A 8-259876 (the term "JP-A" as used herein means an "unexamined published Japanese patent application"), commercial polymer or oligomer for dispersing a pigment, or the like. The description of JP-A 8-259876 is cited in the disclosure of the present invention.

The colorant in the present invention can be used in combination with a dispersant or dispersion aid as required.

Typical examples of the dispersant include polycarboxylates such as polyurethanes and polyacrylates; unsaturated polyamides; (partial) amine salts, ammonium salts and alkyl amine salts of polycarboxylic acids; polysiloxanes; long-chain polyaminoamide phosphates; hydroxyl group-containing polycarboxylates; and modified products thereof; amides formed by reacting polyesters having a free carboxylic acid group with poly(lower alkylene imines) and salts thereof; and the like, under the trade name of Disperbyk-130, 101, 161, 162, 163, 164, 165, 166, 170 (of Big Chemie Japan Co., Ltd.), EFKA-47, 47EA, 48, 49, 100, 400, 450 (of EFKA Co., Ltd.), SOLS PERSE 13240, 13940, 17000, 24000GR, 28000, 20000, 12000, 27000 (of ZENEKA Co., Ltd.).

The dispersant or dispersion aid is, for example, a cationic, anionic, nonionic or amphoteric surfactant, or a silicone-based or fluorine-based surfactant.

Illustrative examples of the surfactant include polyoxyethylene alkyl ethers such as polyoxyethylene lauryl ether, polyoxyethylene stearyl ether and polyoxyethylene oleyl ether; polyoxyethylene alkylphenyl ethers such as polyoxyethylene octylphenyl ether and polyoxyethylene nonylphenyl ether; polyethylene glycol diesters such as polyethylene glycol dilaurate and polyethylene glycol distearate; sorbitan fatty acid esters; fatty acid modified polyesters; tertiary amine modified polyurethanes; polyethyleneimines; and the like, under the trade name of KP (Shin-Etsu Chemical Co.), Polyflow (Kyoeisha Yushi Kagaku Kogyo Co.), F-Top (Tokem Products Co.), Megafax (Dainippon Ink & Chemicals Co.), Florade (Sumitomo 3M Co.), Asahi Guard and Surflon (Asahi Glass Co.), and the like.

These dispersants may be used alone or in admixture of two or more.

The dispersant is generally used in an amount of 50 parts or less by weight, preferably 0 to 30 parts by weight based on 100 parts by weight of the colorant.

The dispersant aid is a pigment derivative obtained by treating a pigment with an acid, base or polymer. Illustrative examples of the dispersant aid include blue pigment derivatives such as copper phthalocyanine derivatives; yellow pigment derivatives; and the like.

(B) Binder Polymer

Any polymer may be used as the binder polymer in the present invention as long as it serves as a binder for the colorant (A) and is soluble in an alkali developer used in the development step for the production of a color filter.

The binder polymer is a polymer containing an acidic functional group such as carboxyl group or phenolic hydroxyl group.

The binder polymer in the present invention is preferably a polymer containing a carboxyl group, particularly a copolymer (to be simply referred to as "carboxyl group-containing copolymer" hereinafter) of an ethylenically unsaturated monomer having at least one carboxyl group (to be simply referred to as "carboxyl group-containing unsaturated monomer" hereinafter) and other copolymerizable ethylenically unsaturated monomer (to be simply referred to as "other unsaturated monomer" hereinafter).

Illustrative examples of the carboxyl group-containing unsaturated monomer include unsaturated monocarboxylic acids such as acrylic acid, methacrylic acid, crotonic acid, α-chloroacrylic acid, ethacrylic acid and cinammic acid; unsaturated dicarboxylic acids (anhydrides) such as maleic acid, maleic anhydride, fumaric acid, itaconic acid, itaconic anhydride, citraconic acid, citraconic anhydride and mesaconic acid; unsaturated polycarboxylic acids (anhydrides) having at least three carboxyl groups in the molecule; mono(meth)acryloyloxyalkyl esters of non-polymerizable dicarboxylic acids such as mono(2-acryloyloxyethyl)ester of succinic acid, mono(2-methacryloyloxyethyl)ester of succinic acid, mono(2-acryloyloxyethyl)ester of phthalic acid and mono(2-methacryloyloxyethyl)ester of phthalic acid; ω-carboxy-polycaprolactone monoacrylate, ω-carboxy-polycaprolactone monomethacrylate and the like.

These carboxyl group-containing unsaturated monomers may be used alone or in admixture of two or more.

Illustrative examples of the other unsaturated monomer include aromatic vinyl compounds such as styrene, α-methylstyrene, o-vinyltoluene, m-vinyltoluene, p-vinyltoluene, o-chlorostyrene, m-chlorostyrene, p-chlorostyrene, o-methoxystyrene, m-methoxystyrene, p-methoxystyrene, p-vinylbenzyl methyl ether and p-vinylbenzyl glycidyl ether; unsaturated carboxylates such as methyl acrylate, methyl methacrylate, ethyl acrylate, ethyl methacrylate, n-propyl acrylate, n-propyl methacrylate, i-propyl acrylate, i-propyl methacrylate, n-butyl acrylate, n-butyl methacrylate, i-butyl acrylate, i-butyl methacrylate, sec-butyl acrylate, sec-butyl methacrylate, t-butyl acrylate, t-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, phenyl acrylate, phenyl methacrylate, methoxytriethylene glycol acrylate and methoxytriethylene glycol methacrylate; unsaturated aminoalkyl carboxylates such as 2-aminoethyl acrylate, 2-aminoethyl methacrylate, 2-dimethylaminoethyl acrylate, 2-dimethylaminoethyl methacrylate, 2-aminopropyl acrylate, 2-aminopropyl methacrylate, 2-dimethylaminoproyl acrylate, 2-dimethylaminopropyl methacrylate, 3-aminopropyl acrylate, 3-aminopropyl methacrylate, 3-dimethylaminopropyl acrylate and 3-dimethylaminopropyl methacrylate; unsaturated glycidyl carboxylates such as glycidyl acrylate and glycidyl methacrylate; vinyl carboxylates such as vinyl acetate, vinyl propionate, vinyl butyrate and vinyl benzoate; unsaturated ethers such as vinylmethyl ether, vinylethyl ether, allyl glycidyl ether and methallyl glycidyl ether; vinyl cyanide compounds such as acrylonitrile, methacrylonitrile, α-chloroacrylonitrile and vinylidene cyanide; unsaturated amides and unsaturated imides such as acrylamide, methacrylamide, α-chloroacrylamide, N-(2-hydroxyethyl)acrylamide, N-(2-hydroxyethyl)methacrylamide, maleimide, N-phenylmaleimide and N-cyclohexylmaleimide; aliphatic conjugated dienes such as 1,3-butadiene, isoprene and chloroprene; macromonomers having a monoacryloyl group or monomethacryloyl group at the terminal of a polymer molecular chain such as polystyrene, polymethyl acrylate, polymethyl methacrylate, poly-n-butyl acrylate, poly-n-butyl methacrylate and polysiloxane; and the like.

These other unsaturated monomers may be used alone or in admixture of two or more.

The proportion of the carboxyl group-containing unsaturated monomer in the carboxyl group-containing copolymer is generally 5 to 50 wt %, more preferably 10 to 40 wt %. When the proportion of the carboxyl group-containing unsaturated monomer is less than 5 wt %, the solubility in an alkali developer of the obtained radiation sensitive composition is liable to lower, while when the proportion is more than 50 wt %, the formed pixel pattern is apt to fall off from the substrate or the surface of the pixel is apt to be roughened at the time of development with an alkali developer.

Particularly, the carboxyl group-containing copolymer containing the carboxyl group-containing unsaturated monomer in the above specified proportion has excellent solubility in an alkali developer. In a radiation sensitive composition containing the copolymer as a binder, an undissolved product rarely remains after development with an alkali developer, stains or film residues are hardly produced in an area other than a portion of the substrate where pixels are formed, and a pixel pattern obtained from the composition is not dissolved excessively in the alkali developer, has excellent adhesion to the substrate and does not fall off from the substrate.

The carboxyl group-containing copolymer is particularly preferably a copolymer (to be referred to as "carboxyl group-containing copolymer (I)" hereinafter) of (1) a carboxyl group-containing unsaturated monomer comprising acrylic acid and/or methacrylic acid as an essential component, and mono(2-acryloyloxyethyl)ester of succinic acid and/or mono(2-mechacryloyloxyethyl)ester of succinic acid in some cases, and (2) at least one member selected from the group consisting of styrene, methyl acrylate, methyl methacrylate, 2-hydroxyethyl acrylate, 2-hydroxyethyl methacrylate, allyl (meth)acrylate, benzyl acrylate, benzyl methacrylate, phenyl acrylate, phenyl methacrylate, glycerol monoacrylate, glycerol monomethacrylate, N-phenylmaleimide, polystyrene macromonomer and polymethyl methacrylate macromonomer.

Illustrative examples of the carboxyl group-containing copolymer (I) include two-element and three-element copolymers (to be referred to as "carboxyl group-containing copolymers (Ia)" hereinafter) such as a copolymer of (meth)acrylic acid/benzyl (meth)acrylate, copolymer of (meth)acrylic acid/styrene/methyl (meth)acrylate, copolymer of (meth)acrylic acid/styrene/benzyl (meth)acrylate, copolymer of (meth)acrylic acid/methyl (meth)acrylate/polystyrene macromonomer, copolymer of (meth)acrylic acid/methyl (meth)acrylate/polymethyl methacrylate macromonomer, copolymer of (meth)acrylic acid/benzyl (meth)acrylate/polystyrene macromonomer, copolymer of (meth)acrylic acid/benzyl (meth)acrylate/polymethyl methacrylate macromonomer, copolymer of (meth)acrylic acid/benzyl (meth)acrylate/2-hydroxyethyl (meth)acrylate, copolymer of (meth)acrylic acid/glycerol mono(meth)acrylate/benzyl (meth)acrylate, copolymer of (meth)acrylic acid/glycetol mono(meth)acrylate/phenyl (meth)acrylate, and copolymer of (meth)acrylic acid/glycerol mono(meth)acrylate/N-phenyl maleimide; four-element copolymers (to be referred to as "carboxyl group-containing copolymers (Ib)" hereinafter) such as a copolymer of (meth)acrylic acid/2-hydroxyethyl (meth)acrylate/benzyl (meth)acrylate/polystyrene macromonomer, copolymer of (meth)acrylic acid/2-hydroxyethyl (meth)acrylate/benzyl (meth)acrylate/polymethyl methacrylate macromonomer, copolymer of (meth)acrylic acid/styrene/benzyl (meth)acrylate/N-phenyl maleimide, copolymer of (meth)acrylic acid/styrene/phenyl (meth)acrylate/N-phenyl maleimide, copolymer of (meth)acrylic acid/glycerol mono(meth)acrylate/styrene/benzyl (meth)acrylate, copolymer of (meth)acrylic acid/glycerol mono(meth)acrylate/styrene/phenyl (meth)acrylate, copolymer of (meth)acrylic acid/glycerol mono(meth)acrylate/styrene/N-phenyl maleimide, copolymer of (meth)acrylic acid/glycerol mono(meth)acrylate/methyl (meth)acrylate/benzyl (meth)acrylate, copolymer of (meth)acrylic acid/glycerol mono(meth)acrylate/methyl (meth)acrylate/phenyl (meth)acrylate, copolymer of (meth)acrylic acid/glycerol mono(meth)acrylate/methyl (meth)acrylate/N-phenyl maleimide, copolymer of (meth)acrylic acid/glycerol mono (meth)acrylate/2-hydroxyethyl (meth)acrylate/benzyl (meth)acrylate, copolymer of (meth)acrylic acid/glycerol mono(meth)acrylate/2-hydroxyethyl (meth)acrylate/phenyl (meth)acrylate, copolymer of (meth)acrylic acid/glycerol mono(meth)acrylate/2-hydroxyethyl (meth)acrylate/N-phenyl maleimide, copolymer of (meth)acrylic acid/glycerol mono(meth)acrylate/benzyl (meth)acrylate/phenyl (meth)acrylate, copolymer of (meth)acrylic acid/mono[2-(meth)acryloyloxyethyl]ester of succinic acid/glycerol mono(meth)acrylate/benzyl (meth)acrylate, copolymer of (meth)acrylic acid/glycerol mono(meth)acrylate/benzyl (meth)acrylate/N-phenyl maleimide, copolymer of (meth)acrylic acid/glycerol mono(meth)acrylate/benzyl (meth)acrylate/polystyrene macromonomer, copolymer of (meth)acrylic acid/glycerol mono(meth)acrylate/benzyl (meth)acrylate/polymethyl methacrylate macromonomer, copolymer of (meth)acrylic acid/mono[2-(meth)acryloyloxyethyl]ester of succinic acid/glycerol mono(meth)acrylate/phenyl (meth)acrylate, copolymer of (meth)acrylic acid/glycerol mono(meth)acrylate/phenyl (meth)acrylate/N-phenyl maleimide, copolymer of (meth)acrylic acid/glycerol mono(meth)acrylate/phenyl (meth)acrylate/polystyrene macromonomer, copolymer of (meth)acrylic acid/glycerol mono(meth)acrylate/phenyl (meth)acrylate/polymethyl methacrylate macromonomer, copolymer of (meth)acrylic acid/mono[2-(meth)acryloyloxyethyl]ester of succinic acid/glycerol mono(meth)acrylate/N-phenyl maleimide, copolymer of (meth)acrylic acid/glycerol mono(meth)acrylate/N-phenyl maleimide/polystyrene macromonomer, and copolymer of (meth)acrylic acid/glycerol mono(meth)acrylate/N-phenyl maleimide/polymethyl methacrylate macromonomer; five-element copolymers (to be referred to as "carboxyl group-containing copolymers (Ic)" hereinafter) such as a copolymer of (meth)acrylic acid/styrene/benzyl (meth)acrylate/N-phenyl maleimide/polystyrene macromonomer, copolymer of (meth)acrylic acid/styrene/benzyl (meth)acrylate/N-phenyl maleimide/polymethyl methacrylate macromonomer, copolymer of (meth)acrylic acid/styrene/phenyl (meth)acrylate/N-phenyl maleimide/polystyrene macromonomer, copolymer of (meth)acrylic acid/styrene/phenyl (meth)acrylate/N-phenyl maleimide/polymethyl methacrylate macromonomer, copolymer of (meth)acrylic acid/glycerol mono(meth)acrylate/styrene/methyl (meth)acrylate/benzyl (meth)acrylate, copolymer of (meth)acrylic acid/glycerol mono(meth)acrylate/styrene/methyl (meth)acrylate/phenyl (meth)acrylate, copolymer of (meth)acrylic acid/glycerol mono(meth)acrylate/styrene/methyl (meth)acrylate/N-phenyl maleimide, copolymer of (meth)acrylic acid/glycerol mono(meth)acrylate/styrene/2-hydroxyethyl (meth)acrylate/benzyl (meth)acrylate, copolymer of (meth)acrylic acid/glycerol mono(meth)acrylate/styrene/2-hydroxyethyl (meth)acrylate/phenyl (meth)acrylate, copolymer of (meth)acrylic acid/glycerol mono(meth)acrylate/styrene/2-hydroxyethyl (meth)acrylate/N-phenyl maleimide, copolymer of (meth)acrylic acid/glycerol mono(meth)acrylate/styrene/benzyl (meth)acrylate/phenyl (meth)acrylate, copolymer of (meth)acrylic acid/mono[2-(meth)acryloyloxyethyl]ester of succinic acid/glycerol mono(meth)acrylate/styrene/benzyl (meth)acrylate, copolymer of (meth)acrylic acid/glycerol mono(meth)acrylate/styrene/benzyl (meth)acrylate/N-phenyl maleimide, copolymer of (meth)acrylic acid/glycerol mono(meth)acrylate/styrene/benzyl (meth)acrylate/polystyrene macromonomer, copolymer of (meth)acrylic acid/glycerol mono(meth)acrylate/styrene/benzyl (meth)acrylate/polymethyl methacrylate macromonomer, copolymer of (meth)acrylic acid/mono[2-(meth)acryloyloxyethyl]ester of succinic acid/glycerol mono(meth)acrylate/styrene/phenyl (meth)acrylate, copolymer of (meth)acrylic acid/glycerol mono(meth)acrylate/ styrene/phenyl (meth)acrylate/N-phenyl maleimide, copolymer of (meth)acrylic acid/glycerol mono(meth)acrylate/styrene/phenyl (meth)acrylate/polystyrene macromonomer, copolymer of (meth)acrylic acid/glycerol mono(meth)acrylate/styrene/phenyl (meth)acrylate/polymethyl methacrylate macromonomer, copolymer of (meth)acrylic acid/mono[2-(meth)acryloyloxyethyl]ester of succinic acid/glycerol mono(meth)acrylate/styrene/N-phenyl maleimide, copolymer of (meth)acrylic acid/glycerol mono(meth)acrylate/styrene/N-phenyl maleimide/polystyrene macromonomer, copolymer of (meth)acrylic acid/glycerol mono(meth)acrylate/styrene/N-phenyl maleimide/polymethyl methacrylate macromonomer, copolymer of (meth)acrylic acid/glycerol mono(meth)acrylate/methyl (meth)acrylate/ 2-hydroxyethyl (meth)acrylate/benzyl (meth)acrylate, copolymer of (meth)acrylic acid/glycerol mono(meth)acrylate/methyl (meth)acrylate/2-hydroxyethyl (meth)acrylate/phenyl (meth)acrylate, copolymer of (meth)acrylic acid/glycerol mono(meth)acrylate/methyl (meth)acrylate/2-hydroxyethyl (meth)acrylate/N-phenyl maleimide, copolymer of (meth)acrylic acid/glycerol mono(meth)acrylate/methyl (meth)acrylate/benzyl (meth)acrylate/phenyl (meth)acrylate, copolymer of (meth)acrylic acid/mono[2-(meth)acryloyloxyethyl]ester of succinic acid/glycerol mono(meth)acrylate/methyl (meth)acrylate/benzyl (meth)acrylate, copolymer of (meth)acrylic acid/glycerol mono(meth)acrylate/methyl (meth)acrylate/benzyl (meth)acrylate/N-phenyl maleimide, copolymer of (meth)acrylic acid/glycerol mono(meth)acrylate/methyl (meth)acrylate/benzyl (meth)acrylate/polystyrene macromonomer, copolymer of (meth)acrylic acid/glycerol mono(meth)acrylate/methyl (meth)acrylate/benzyl (meth)acrylate/polymethyl methacrylate macromonomer, copolymer of (meth)acrylic acid/mono[2-(meth)acryloyloxyethyl]ester of succinic acid/glycerol mono(meth)acrylate/methyl (meth)acrylate/phenyl (meth)acrylate, copolymer of (meth)acrylic acid/glycerol mono(meth)acrylate/methyl (meth)acrylate/phenyl (meth)acrylate/N-phenyl maleimide, copolymer of (meth)acrylic acid/glycerol mono(meth)acrylate/methyl (meth)acrylate/phenyl (meth)acrylate/polystyrene macromonomer, copolymer of (meth)acrylic acid/glycerol mono(meth)acrylate/methyl (meth)acrylate/phenyl (meth)acrylate/polymethyl methacrylate macromonomer, copolymer of (meth)acrylic acid/mono[2-(meth)acryloyloxyethyl]ester of succinic acid/glycerol mono(meth)acrylate/methyl (meth)acrylate/N-phenyl maleimide, copolymer of (meth)acrylic acid/glycerol mono(meth)acrylate/methyl (meth)acrylate/N-phenyl maleimide/polystyrene macromonomer, copolymer of (meth)acrylic acid/glycerol mono(meth)acrylate/methyl (meth)acrylate/N-phenyl maleimide/polymethyl methacrylate macromonomer, copolymer of (meth)acrylic acid/glycerol mono(meth)acrylate/2-hydroxyethyl (meth)acrylate/benzyl (meth)acrylate/phenyl (meth)acrylate, copolymer of (meth)acrylic acid/mono[2-(meth)acryloyloxyethyl]ester of succinic acid/glycerol mono(meth)acrylate/2-hydroxyethyl (meth)acrylate/benzyl (meth)acrylate, copolymer of (meth)acrylic acid/glycerol mono(meth)acrylate/2-hydroxyethyl (meth)acrylate/benzyl (meth)acrylate/N-phenyl maleimide, copolymer of (meth)acrylic acid/glycerol mono(meth)acrylate/2-hydroxyethyl (meth)acrylate/benzyl (meth)acrylate/polystyrene macromonomer, copolymer of (meth)acrylic acid/glycerol mono(meth)acrylate/2-hydroxyethyl (meth)acrylate/benzyl (meth)acrylate/polymethyl methacrylate macromonomer, copolymer of (meth)acrylic acid/mono[2-(meth)acryloyloxyethyl]ester of succinic acid/glycerol mono(meth)acrylate/2-hydroxyethyl (meth)acrylate/phenyl (meth)acrylate, copolymer of (meth)acrylic acid/glycerol mono(meth)acrylate/2-hydroxyethyl (meth)acrylate/phenyl (meth)acrylate/N-phenyl maleimide, copolymer of (meth) acrylic acid/glycerol mono(meth)acrylate/2-hydroxyethyl (meth)acrylate/phenyl (meth)acrylate/polystyrene macromonomer, copolymer of (meth)acrylic acid/glycerol mono(meth)acrylate/2-hydroxyethyl (meth)acrylate/phenyl (meth)acrylate/polymethyl methacrylate macromonomer, copolymer of (meth)acrylic acid/mono[2-(meth) acryloyloxyethyl]ester of succinic acid/glycerol mono (meth)acrylate/2-hydroxyethyl (meth)acrylate/N-phenyl maleimide, copolymer of (meth)acrylic acid/glycerol mono (meth)acrylate/2-hydroxyethyl (meth)acrylate/N-phenyl maleimide/polystyrene macromonomer, copolymer of (meth)acrylic acid/glycerol mono(meth)acrylate/2-hydroxyethyl (meth)acrylate/N-phenyl maleimide/ polymethyl methacrylate macromonomer, copolymer of (meth)acrylic acid/mono[2-(meth)acryloyloxyethyl]ester of succinic acid/glycerol mono(meth)acrylate/benzyl (meth) acrylate/phenyl (meth)acrylate, copolymer of (meth)acrylic acid/glycerol mono(meth)acrylate/benzyl (meth)acrylate/ phenyl (meth)acrylate/N-phenyl maleimide, copolymer of (meth)acrylic acid/glycerol mono(meth)acrylate/benzyl (meth)acrylate/phenyl (meth)acrylate/polystyrene macromonomer, copolymer of (meth)acrylic acid/glycerol mono(meth)acrylate/benzyl (meth)acrylate/phenyl (meth) acrylate/polymethyl methacrylate macromonomer, copolymer of (meth)acrylic acid/mono[2-(meth)acryloyloxyethyl] ester of succinic acid/glycerol mono(meth)acrylate/benzyl (meth)acrylate/N-phenyl maleimide, copolymer of (meth) acrylic acid/mono[2-(meth)acryloyloxyethyl]ester of succinic acid/glycerol mono(meth)acrylate/benzyl (meth) acrylate/polystyrene macromonomer, copolymer of (meth) acrylic acid/mono[2-(meth)acryloyloxyethyl]ester of succinic acid/glycerol mono(meth)acrylate/benzyl (meth) acrylate/polymethyl methacrylate macromonomer, copolymer of (meth)acrylic acid/glycerol mono(meth)acrylate/ benzyl (meth)acrylate/N-phenyl maleimide/polystyrene macromonomer, copolymer of (meth)acrylic acid/glycerol mono(meth)acrylate/benzyl (meth)acrylate/N-phenyl maleimide/polymethyl methacrylate macromonomer, copolymer of (meth)acrylic acid/mono[2-(meth) acryloyloxyethyl]ester of succinic acid/glycerol mono (meth)acrylate/phenyl (meth)acrylate/N-phenyl maleimide, copolymer of (meth)acrylic acid/mono[2-(meth) acryloyloxyethyl]ester of succinic acid/glycerol mono (meth)acrylate/phenyl (meth)acrylate/polystyrene macromonomer, copolymer of (meth)acrylic acid/mono[2-(meth)acryloyloxyethyl]ester of succinic acid/glycerol mono(meth)acrylate/phenyl (meth)acrylate/polymethyl methacrylate macromonomer, copolymer of (meth)acrylic acid/glycerol mono(meth)acrylate/phenyl (meth)acrylate/N-phenyl maleimide/polystyrene macromonomer, copolymer of (meth)acrylic acid/glycerol mono(meth)acrylate/phenyl (meth)acrylate/N-phenyl maleimide/polymethyl methacrylate macromonomer, copolymer of (meth)acrylic acid/mono [2-(meth)acryloyloxyethyl]ester of succinic acid/glycerol mono(meth)acrylate/N-phenyl maleimide/polystyrene macromonomer, copolymer of (meth)acrylic acid/mono[2-(meth)acryloyloxyethyl]ester of succinic acid/glycerol mono(meth)acrylate/N-phenyl maleimide/polymethyl methacrylate macromonomer, copolymer of (meth)acrylic acid/ N-phenyl maleimide/styrene/mono[2-(meth) acryloyloxyethyl]ester of succinic acid/benzyl (meth) acrylate, and copolymer of (meth)acrylic acid/N-phenyl maleimide/styrene/allyl (meth)acrylate/mono[2-(meth) acryloyloxyethyl]ester of succinic acid; and six-element copolymers (to be referred to as "carboxyl group-containing copolymers (Id)" hereinafter) such as a copolymer of (meth) acrylic acid/styrene/2-hydroxyethyl (meth)acrylate/benzyl (meth)acrylate/N-phenyl maleimide/polystyrene macromonomer, copolymer of (meth)acrylic acid/styrene/2-hydroxyethyl (meth)acrylate/benzyl (meth)acrylate/N-phenyl maleimide/polymethyl methacrylate macromonomer, copolymer of (meth)acrylic acid/styrene/2-hydroxyethyl (meth)acrylate/phenyl (meth)acrylate/N-phenyl maleimide/polystyrene macromonomer, and copolymer of (meth)acrylic acid/styrene/2-hydroxyethyl (meth) acrylate/phenyl (meth)acrylate/N-phenyl maleimide/ polymethyl methacrylate macromonomer.

The carboxyl group-containing copolymers (I) may be used alone or in admixture of two or more. In the present invention, at least one other binder polymer may be used in conjunction with the carboxyl group-containing copolymer (I) in some cases.

The binder polymer preferably has a weight average molecular weight in terms of polystyrene measured by gel permeation chromatography (GPC: tetrahydrofuran as a solvent) (to be simply referred to as "weight average molecular weight" hereinafter) of 3,000 to 300,000, more preferably 5,000 to 100,000. The ratio of the weight average molecular weight Mw to the number average molecular weight Mn is preferably 1 to 5, more preferably 1.5 to 4, much more preferably 2 to 3.5.

By using the binder polymer having such specific weight average molecular weight, a radiation sensitive composition having excellent developability can be obtained, whereby a pixel array having a sharp pattern edge can be formed, and stains, film residues or the like are hardly produced in an area other than a portion of the substrate where pixels are formed at the time of development.

The amount of the binder polymer used in the present invention is generally 10 to 1,000 parts by weight, preferably 20 to 500 parts by weight based on 100 parts by weight of the colorant (A). When the amount of the binder polymer used is smaller than 10 parts by weight, alkali developability may deteriorate, or stains or film residues may be produced in an area other than a portion where pixels are formed. On the other hand, when the amount is larger than 1,000 parts by weight, it may be difficult to attain a thin film having a target color density due to a reduction in the concentration of the colorant.

(C) Polyfunctional Monomer

The polyfunctional monomer in the present invention is a monomer having at least two polymerizable ethylenically unsaturated bonds.

Illustrative examples of the polyfunctional monomer include diacrylates and dimethacrylates of alkylene glycols such as ethylene glycol and propylene glycol; diacrylates and dimethacrylates of polyalkylene glycols such as polyethylene glycol and polypropylene glycol; oligoacrylates and oligomethacrylates of polyhydric alcohols having a valence of 3 or more such as glycerin, trimethylolpropane, pentaerythritol and dipentaerythritol; free carboxyl group-containing monoesterified products of monohydroxy oligoacrylates and monohydroxy oligomethacrylates such as trimethylolpropane diacrylate, trimethylolpropane dimethacrylate, pentaerythritol triacrylate, pentaerythritol trimethacrylate, dipentaerythritol pentaacrylate and dipentaerythritol pentamethacrylate and dicarboxylic acids such as malonic acid, succinic acid, glutaric acid and terephthalic acid; free carboxyl group-containing oligoesterified products of tricarboxylic acids such as propane-1,2,3-tricarboxylic acid (tricarballylic acid), butane-1,2,4- tricarboxylic acid, benzene-1,2,3-tricarboxylic acid, benzene-1,3,4-tricarboxylic acid and benzene-1,3,5-tricarboxylic acid and monohydroxy monoacrylates and monohydroxy monomethacrylates such as 2-hydroxyethyl acrylate, 2-hydroxyethyl methacrylate, 2-hydroxypropyl acrylate and 2-hydroxypropyl methacrylate; oligoacrylates and oligomethacrylates such as polyesters, epoxy resins, urethane resins, alkyd resins, silicone resins and spiran resins; diacrylates and dimethacrylates of both terminal hydroxylated polymers such as both-terminal hydroxypoly-1,3-butadiene, both-terminal hydroxypolyisoprene and both-terminal hydroxypolycaprolactone; tris(2-acryloyloxyethyl)phosphate, tris(2-methacryloyloxyethyl) phosphate, and the like.

Of these polyfunctional monomers, preferred are oligoacrylates and oligomethacrylates of polyhydric alcohols having a valence of 3 or more such as trimethylolpropane triacrylate, trimethylolpropane trimethacrylate, pentaerythritol triacrylate, pentaerythritol trimethacrylate, dipentaerythritol pentaacrylate, dipentaerythritol pentamethacrylate, dipentaerythritol hexaacrylate and dipentaerythritol hexamethacrylate, and particularly preferred are trimethylolpropane triacrylate, pentaerythritol triacrylate, dipentaerythritol pentaacrylate and dipentaerythritol hexaacrylate.

The above polyfunctional monomers may be used alone or in admixture of two or more.

The amount of the polyfunctional monomer used in the present invention is generally 5 to 500 parts by weight, preferably 20 to 300 parts by weight based on 100 parts by weight of the binder polymer (B). When the amount of the polyfunctional monomer is smaller than 5 parts by weight, the pixel strength or the smoothness of the pixel surface is liable to deteriorate, while when the amount is larger than 500 parts by weight, alkali developability is apt to lower, or stains or film residues are readily produced in an area other than a portion where pixels are formed, for example.

A description is subsequently given of the component (D) of the radiation sensitive composition of the present invention, that is, the component (D1) of the first composition, the component (D2) of the second composition, the component (D3) of the third composition and the component (D4) of the fourth composition.

(D1) Carboxyl Group-containing Monofunctional Monomer

The carboxyl group-containing monofunctional monomer in the present invention is at least one member selected from the group consisting of ω-carboxy-polycaprolactone monoacrylate, ω-carboxy-polycaprolactone monomethacrylate, acrylic acid dimer, methacrylic acid dimer, mono(2-acryloyloxyethyl)ester of dicarboxylic acid and mono(2-methacryloyloxyethyl)ester of dicarboxylic acid.

Illustrative examples of the dicarboxylic acid in the mono(2-acryloyloxyethyl)ester of dicarboxylic acid and mono(2-methacryloyloxyethyl)ester of dicarboxylic acid include aliphatic dicarboxylic acids such as oxalic acid, malonic acid, succinic acid, glutaric acid and adipic acid; alicyclic dicarboxylic acids such as hexahydrophthalic acid, hexahydroisophthalic acid and hexahydroterephthalic acid; aromatic dicarboxylic acids such as phthalic acid, isophthalic acid and terephthalic acid; and the like.

Of these dicarboxylic acids, aliphatic dicarboxylic acids are preferred and succinic acid is particularly preferred.

In the present invention, particularly preferred carboxyl group-containing monofunctional monomers are ω-carboxy-polycaprolactone monoacrylate and mono(2-acryloyloxyethyl)ester of succinic acid.

The above carboxyl group-containing monofunctional monomers may be used alone or in admixture of two or more.

The amount of the carboxyl group-containing monofunctional monomer is generally 1 to 90 wt %, preferably 1 to 50 wt % based on the total of the polyfunctional monomer and the carboxyl group-containing monofunctional monomer. When the amount of the carboxyl group-containing monofunctional monomer is smaller than 1 wt %, a pixel pattern may be partially or completely lost, an undissolved product (residue) of the composition may remain in unexposed portions or scum may be produced on pixels, and the adhesion strength of the obtained pixel to the substrate may lower. On the other hand, when the amount is larger than 90 wt %, the pixel strength and the smoothness of the pixel surface are liable to deteriorate.

In the present invention, part of the carboxyl group-containing monofunctional monomer may be substituted by other carboxyl group-containing monofunctional monomer. The amount of other carboxyl group-containing monofunctional monomer is generally 50 wt % or less, preferably 10 wt % or less based on the total of all the carboxyl group-containing monofunctional monomers.

(D2) Amide Group-containing Monoethylenically Unsaturated Monomer

Illustrative examples of the amide group-containing monoethylenically unsaturated monomer in the present invention include acrylamide, methacrylamide, N-methylol acrylamide, N-methylol methacrylamide, N,N-dimethyl acrylamide, N,N-dimethyl methacrylamide, N,N-(3-dimethylaminopropyl)acrylamide, N,N-(3-dimethylaminopropyl)methacrylamide and the like. Of these, methacrylamide is particularly preferred.

The above amide group-containing monoethylenically unsaturated monomers may be used alone or in admixture of two or more.

The amount of the amide group-containing monoethylenically unsaturated monomer in the present invention is generally 0.1 to 50 parts by weight, preferably 1 to 20 parts by weight, more preferably 1 to 10 parts by weight based on 100 parts by weight of the binder polymer (B). When the amount of the amide group-containing monoethylenically unsaturated monomer is smaller than 0.1 part by weight, the pixel strength or the smoothness of the pixel surface is liable to deteriorate. On the other hand, when the amount is larger than 50 parts by weight, alkali developability is apt to lower, or stains or film residues are readily produced in an area other than a portion where pixels are formed, for example.

(D3) Monofunctional Monomer having a Cyclic Amide Group or Imide Group

The monofunctional monomer having a cyclic amide group or imide group in the present invention is a monomer having a cyclic amide group or imide group and one polymerizable ethylenically unsaturated bond (to be referred to as "monofunctional monomer (D3)" hereinafter).

In the monofunctional monomer (D3), the cyclic amide group is, for example, a cyclic amide group derived from an aliphatic aminocarboxylic acid having 3 to 5 carbon atoms such as β-aminopropionic acid, γ-aminonbutyric acid, δ-aminovaleric acid or ε-aminocaproic acid.

The imide group is, for example, an imide group derived from an aliphatic dicarboxylic acid having 4 to 6 carbon atoms such as succinic acid, glutaric acid or adipic acid; an imide group derived from an alicyclic dicarboxylic acid having 7 to 9 carbon atoms such as cyclopentane-1,2-dicarboxylic acid, cyclohexane-1,2-dicarboxylic acid, 1-cyclohexene-1,2-dicarboxylic acid or 4-cyclohexene-1,2- dicarboxylic acid; or an imide group derived from an aromatic dicarboxylic acid having 8 to 10 carbon atoms such as phthalic acid or naphthalene-2,3-dicarboxylic acid.

Of these cyclic amide groups and imide groups, groups having 5 constituent atoms are preferred, and a cyclic amide group derived from γ-aminobutyric acid and an imide group derived from succinic acid, cyclohexane-1,2-dicarboxylic acid, 1-cyclohexene-1,2-dicarboxylic acid or 4-cyclohexene-1,2-dicarboxylic acid are particularly preferred.

The ethylenically unsaturated bond of the monofunctional monomer (D3) is not particularly limited as long as the monomer is polymerizable, but acryloyl group and methacryloyl group are particularly preferred.

The bonding relationship between the cyclic amide group or imide group and the polymerizable ethylenically unsaturated bond of the monofunctional monomer (D3) is not particularly limited. However, it is preferred that the polymerizable ethylenically unsaturated bond is linked to the nitrogen atom of the cyclic amide group or imide group directly or through a divalent organic group.

Preferred examples of the monofunctional monomer (D3) in the present invention are compounds represented by the following formula (1):

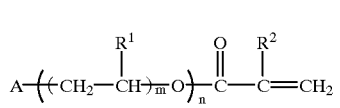

(1)

wherein A is a group having a cyclic imide group or cyclic amide group, the bond from A being the bond from the nitrogen atom of the cyclic imide group or cyclic amide group, $R^1$ and $R^2$ are independently a hydrogen atom or a methyl group, and m and n are independently an integer of 1 to 3.

More preferred examples of the monofunctional monomer (D3) include compounds represented by the following structural formulas (1-1) to (1-40).

(1-1)

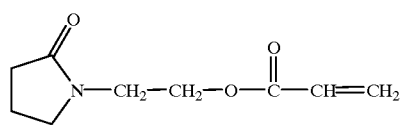

(1-2)

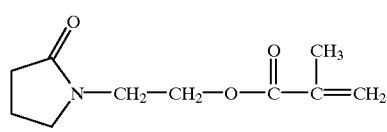

(1-3)

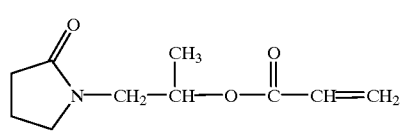

(1-4)

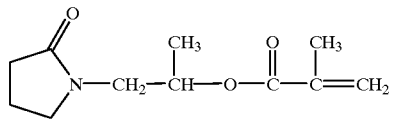

(1-5)

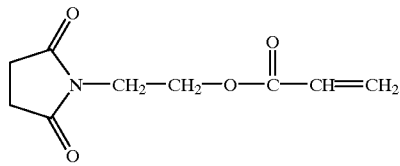

(1-6)

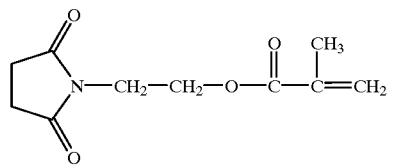

(1-7)

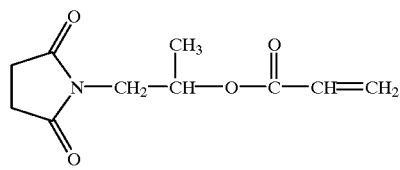

(1-8)

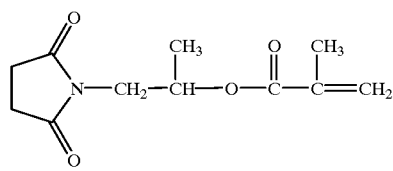

(1-9)

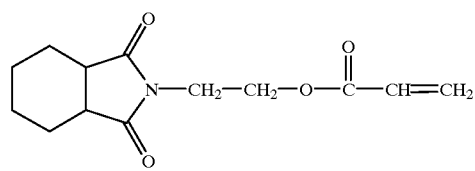

(1-10)

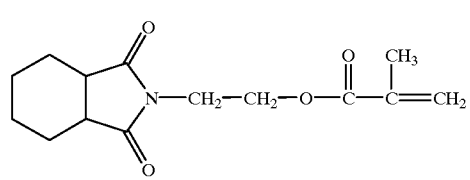

(1-11)

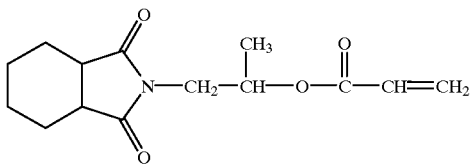

(1-12)

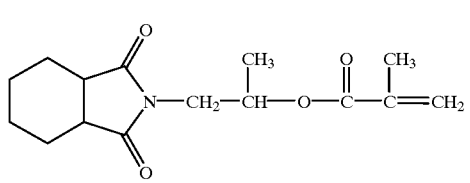

-continued (1-13), (1-14), (1-15), (1-16), (1-17), (1-18), (1-19), (1-20), (1-21), (1-22), (1-23), (1-24), (1-25), (1-26), (1-27), (1-28), (1-29), (1-30)

(1-31) 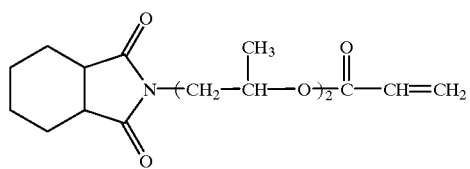

(1-32) 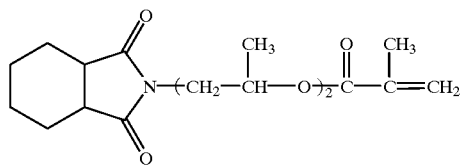

(1-33) 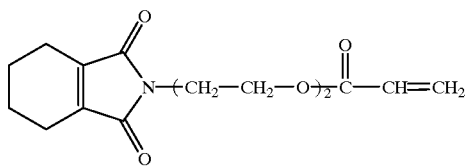

(1-34) 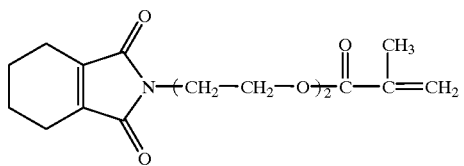

(1-35) 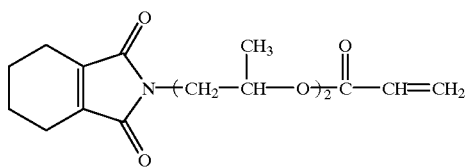

(1-36) 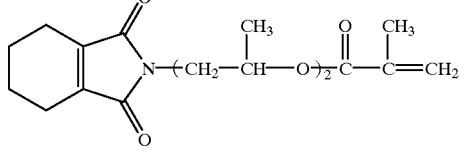

(1-37) 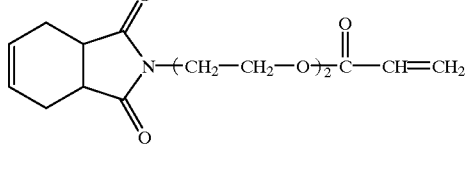

(1-38) 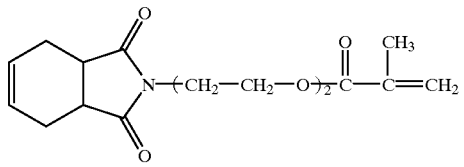

(1-39) 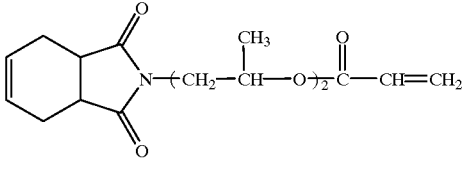

(1-40) 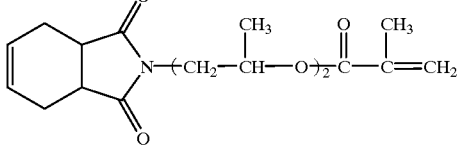

Of the compounds represented by the above structural formulas, compounds represented by structural formulas (1-2),(1-2),(1-5),(1-6),(1-9), (1-10),(1-11),(1-12), (1-13), (1-14), (1-17), (1-18), (1-29) and (1-30) are particularly preferred.

In the present invention, the above monofunctional monomers (D3) may be used alone or in admixture of two or more.

In the present invention, the amount of the monofunctional monomer (D3) is generally 1 to 90 wt %, preferably 1 to 50 wt %, more preferably 1 to 30 wt % based on the total of the monofunctional monomer (D3) and the polyfunctional monomer (C). When the amount of the monofunctional monomer (D3) is smaller than 1 wt %, a pixel pattern may be partially or completely lost, an undissolved product (residue) of the composition may remain in unexposed portions or scum may be produced on pixels, and the adhesion strength of the obtained pixel to the substrate may lower. On the other hand, when the amount is larger than 90 wt %, the pixel strength or the smoothness of the pixel surface is apt to lower.

(D4) Phenyl Group-containing (meth)acrylate

The phenyl group-containing (meth)acrylate in the present invention is a compound represented by the above formula (2) or (3).

Illustrative examples of the compound represented by the formula (2) include

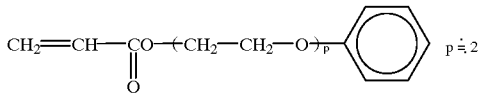 p ≐ 2

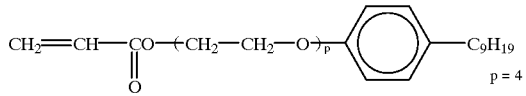 p = 4

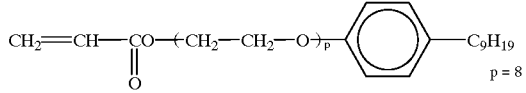 p = 8

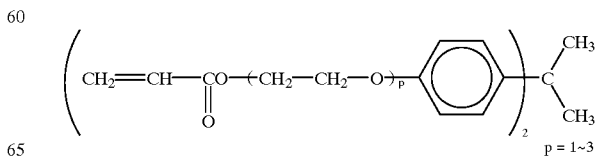 p = 1~3

-continued

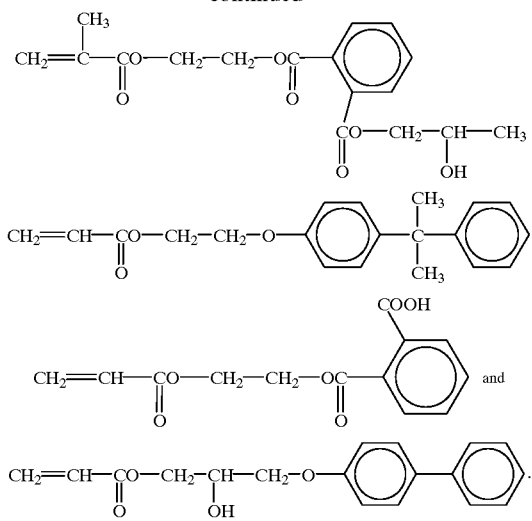

These compounds are marketed under the trade name of Light Acrylate P-200A, Light Acrylate NP-4EA, Light Acrylate NP-8EA, Light Ester BP-2EM and Light Ester HO-MPP (of Kyoeisha Kagaku Co., Ltd.), and M110 and TO1317 (of Toagosei Chemical Industry Co., Ltd.), respectively.

Illustrative examples of the compound represented by the formula (3) include

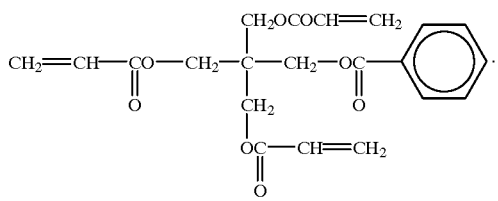

These compounds are marketed under the trade name of M5400 (of Toagosei Chemical Industry Co., Ltd.) and BA134 (of Kyoeisha Kagaku Co., Ltd.), respectively.

In the present invention, the amount of the phenyl group-containing (meth)acrylate (D4) is generally 1 to 90 wt %, preferably 1 to 50 wt %, more preferably 1 to 30 wt % based on the total of the phenyl group-containing (meth)acrylate (D4) and the polyfunctional monomer (C). When the amount of the phenyl group-containing (meth)acrylate (D4) is smaller than 1 wt %, a pixel pattern may be partially or completely lost, an undissolved product (residue) of the composition may remain in unexposed portions or scum may be produced on pixels, and the adhesion of the obtained pixels to the substrate may lower. On the other hand, when the amount is larger than 90 wt %, the pixel strength or the smoothness of the pixel surface is apt to lower.

In the present invention, when a radiation sensitive composition is prepared using the components (D3) or (D4), the components (D3) or (D4) may be added at the time of dispersing the colorant (A).

(E) Photopolymerizatton Initiator

It should be understood that the following description of the photopolymerization initiator is common to the first, second, third and fourth compositions of the present invention.

The term "photopolymerization initiator" as used in the present invention means a compound which forms radical, cationic or anionic active species capable of starting the polymerization of the above components (C) and (D) due to the decomposition or cleavage of a bond caused by exposure.

The photopolymerization initiator is a compound having a biimidazole ring, benzoin-based compound, acetophenone-based compound, benzophenone-based compound, α-diketone-based compound, polynuclear quinone-based compound, xanthone-based compound, or triazine-based compound (to be referred to as "compound having a biimidazole ring or the like" hereinafter).

Illustrative examples of the compound having an imidazole ring include compounds represented by the following formula (4) (to be referred to as "biimidazole-based compounds (1)" hereinafter):

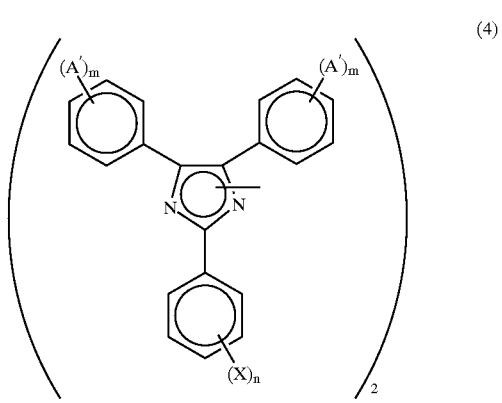

wherein X is a hydrogen atom, halogen atom, cyano group, alkyl group having 1 to 4 carbon atoms and aryl group having 6 to 9 carbon atoms, a plurality of X's may be the same or different, A' is —COO—R (in which R is an alkyl group having 1 to 4 carbon atoms or aryl group having 6 to 9 carbon atoms), a plurality of A's may be the same or different, m is an integer of 1 to 3, and n is an integer of 1 to 3, compounds represented by the following formula (5) (to be referred to as "biimidazole-based compounds (2)" hereinafter):

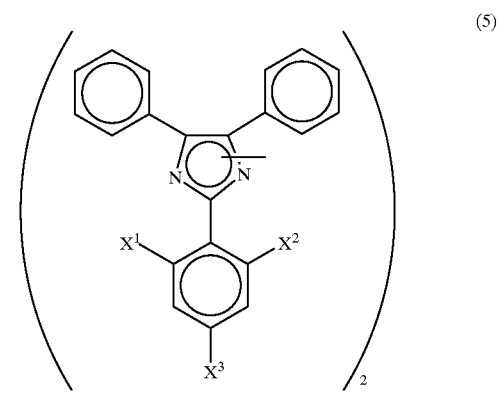

wherein $X^1$, $X^2$ and $X^3$ may be the same or different and are each a hydrogen atom, halogen atom, cyano group, alkyl group having 1 to 4 carbon atoms or aryl group having 6 to 9 carbon atoms, provided that two or more of $X^1$, $X^2$ and $X^3$ cannot be a hydrogen atom at the same time, and the like.

The above formulas (4) and (5) generally show such a structure that two imidazole units are combined together at the 1-position or 2-position. Therefore, the main skeletons of the biimidazole-based compounds (1) and the biimidazole-based compounds (2) are one of compounds represented by any one of the following formulas (6) to (8) or a mixture of two or more thereof.

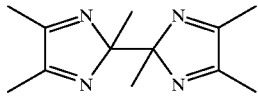

(6)

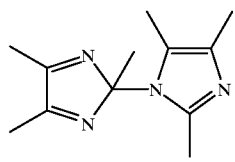

(7)

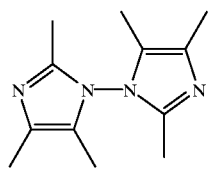

(8)

In the formulas (4) and (5), illustrative examples of the halogen atom represented by X, $X^1$, $X^2$ and $X^3$ include chlorine atom, bromine atom, iodine atom and the like, illustrative examples of the alkyl group having 1 to 4 carbon atoms include methyl group, ethyl group, n-propyl group, i-propyl group, n-butyl group, i-butyl group, sec-butyl group, t-butyl group and the like, and illustrative examples of the aryl group having 6 to 9 carbon atoms include phenyl group, o-tolyl group, m-tolyl group, p-tolyl group and the like.

In the formula (4), R in —COO—R represented by A' is an alkyl group having 1 to 4 carbon atoms or aryl group having 6 to 9 carbon atoms as listed for X.

Illustrative examples of the biimidazole-based compounds (1) and the biimidazole-based compounds (2) are as follows.

The biimidazole-based compounds (1) include 2,2'-bis(2-chlorophenyl)-4,4',5,5'-tetrakis(4-methoxycarbonylphenyl)-1,2'-biimidazole, 2,2'-bis(2-chlorophenyl)-4,4',5,5'-tetrakls(4-ethoxycarbonylphenyl)-1,2'-biimidazole, 2,2'-bis(2-chlorophenyl)-4,4',5,5'-tetrakis(4-phenoxycarbonylphenyl)-1,2'-biimidazole, 2,2'-bis(2,4-dichlorophenyl)-4,4',5,5'-tetrakis(4-methoxycarbonylphenyl)-1,2'-biimidazole, 2,2'-bis(2,4-dichlorophenyl)-4,4',5,5'-tetrakis(4-ethoxycarbonylphenyl)-1,2'-biimidazole, 2,2'-bis(2,4-dichlorophenyl)-4,4',5,5'-tetrakis(4-phenoxycarbonylphenyl)-1,2'-biimidazole, 2,2'-bis(2,4,6-trichlorophenyl)-4,4',5,5'-tetrakis(4-methoxycarbonylphenyl)-1,2'-biimidazole, 2,2'-bis(2,4,6-trichlorophenyl)-4,4',5,5'-tetrakis(4-ethoxycarbonylphenyl)-1,2'-biimidazole, 2,2'-bis(2,4,6-trichlorophenyl)-4,4',5,5'-tetrakis(4-phenoxycarbonylphenyl)-1,2'-biimidazole, 2,2'-bis(2-cyanophenyl)-4,4,'5,5'-tetrakis(4-methoxycarbonylphenyl)-1,2'-biimidazole, 2,2'-bis(2-cyanophenyl)-4,4,'5,5'-tetrakis(4-ethoxycarbonylphenyl)-1,2'-biimidazole, 2,2'-bis(2-cyanophenyl)-4,4',5,5'-tetrakis(4-phenoxycarbonylphenyl)-1,2'-biimidazole, 2,2'-bis(2-methylphenyl)-4,4'5,5'-tetrakis(4-methoxycarbonylphenyl)-1,2'-biimidazole, 2,2'-bis(2-methylphenyl)-4,4',5,5'-tetrakis(4-ethoxycarbonylphenyl)-1,2'-biimidazole, 2,2'-bis(2-methylphenyl)-4,4',5,5'-tetrakis(4-phenoxycarbonylphenyl)-1,2'-biimidazole, 2,2'-bis(2-ethylphenyl)-4,4',5,5'-tetrakis(4-methoxycarbonylphenyl)-1,2'-biimidazole, 2,2'-bis(2-ethylphenyl)-4,4',5,5'-tetrakis(4-ethoxycarbonylphenyl)-1,2'-biimidazole, 2,2'-bis(2-ethylphenyl)-4,4',5,5'-tetrakis(4-phenoxycarbonylphenyl)-1,2'-biimidazole, 2,2'-bis(2-phenylphenyl)-4,4',5,5'-tetrakis(4-methoxycarbonylphenyl)-1,2'-biimidazole, 2,2'-bis(2-phenylphenyl)-4,4',5,5'-tetrakis(4-ethoxycarbonylphenyl)-1,2'-biimidazole, 2,2'-bis(2-phenylphenyl)-4,4',5,5'-tetrakis(4-phenoxycarbonylphenyl)-1,2'-biimidazole, and the like.

The bimidazole-based compounds (2) include 2,2'-bis(2,4-dichlorophenyl)-4,4',5,5'-tetraphenyl-1,2'-biimidazole, 2,2'-bis(2,4,6-trichlorophenyl)-4,4',5,5'-tetraphenyl-1,2'-biimidazole, 2,2'-bis(2,4-dibromophenyl)-4,4',5,5'-tetraphenyl-1,2'-biimidazole, 2,2'-bis(2,4,6-tribromophenyl)-4,4',5,5'-tetraphenyl-1,2'-biimidazole, 2,2'-bis(2,4-dicyanophenyl)-4,4',5,5'-tetraphenyl-1,2'-biimidazole, 2,2'-bis(2,4,6-tricyanophenyl)-4,4',5,5'-tetraphenyl-1,2'-biimidazole, 2,2'-bis(2,4-dimethylphenyl)-4,4',5,5'-tetraphenyl-1,2'-biimidazole, 2,2'-bis(2,4,6-trimethylphenyl)-4,4',5,5'-tetraphenyl-1,2'-biimidazole, 2,2'-bis(2,4-diethylphenyl)-4,4',5,5'-tetraphenyl-1,2'-biimidazole, 2,2'-bis(2,4,6-triethylphenyl)-4,4',5,5'-tetraphenyl-1,2'-biimidazole, 2,2'-bis(2,4-diphenylphenyl)-4,4',5,5'-tetraphenyl-1,2'-biimidazole, 2,2'-bis(2,4,6-triphenylphenyl)-4,4',5,5'-tetraphenyl-1,2'-biimidazole, and the like.

Of these, particularly preferred biimidazole-based compounds (1) are 2,2'-bis(2-chlorophenyl)-4,4',5,5'-tetrakis(4-ethoxycarbonylphenyl)-1,2'-biimidazole and 2,2'-bis(2-bromophenyl)-4,4',5,5'-tetrakis(4-ethoxycarbonyphenyl)-1,2'-biimidazole. Of these, particularly preferred biimidazole-based compounds (2) are 2,2'-bis(2,4-dichlorophenyl)-4,4',5,5'-tetraphenyl-1,2'-biimidazole, 2,2'-bis(2,4,6-trichlorophenyl)-4,4',5,5'-tetraphenyl-1,2'-biimidazole, 2,2'-bis(2,4-dibromophenyl)-4,4',5,5'-tetraphenyl-1,2'-biimidazole and 2,2'-bis(2,4,6-tribromophenyl)-4,4',5,5'-tetraphenyl-1,2'-biimidazole.

The biimidazole-based compounds (1) and the biimidazole-based compounds (2) have excellent solubility in a solvent and does not produce foreign matter such as undissolved product and deposit. In addition, they have high sensitivity, fully promote a curing reaction by exposure with a small amount of energy, provide high contrast and are free from a curing reaction in an unexposed portion. Therefore, the exposed coating films of these compounds are clearly divided into cured portions insoluble in a developer and uncured portions highly soluble in the developer, thereby making it possible to form a color filter having no partial or complete loss or undercut of a pixel pattern.

Illustrative examples of the benzoin-based compound include benzoin, benzoin methylether, benzoin ethylether, benzoin i-propylether, benzoin i-butylether, methyl-2-benzoyl benzoate and the like.

Illustrative examples of the acetophenone-based compound include 2,2-dimethoxy-2-phenylacetophenone, 2-hydroxy-2-methyl-1-phenylpropan-1-one, 1-(4-i-propylphenyl)-2-hydroxy-2-methylpropan-1-one, 4-(2-hydroxyethoxy)phenyl-(2-hydroxy-2-propyl)ketone, 2,2-dimethoxyacetophenone, 2,2-diethoxyacetophenone, 2-methyl-(4-methylthiophenyl)-2-morpholino-1-propan-1-one, 2-benzyl-2-dimethylamino-1-(4-morpholinophenyl) butan-1-one, 1-hydroxycyclohexylphenyl ketone, 2,2-dimethoxy-1,2-diphenylethan-1-one and the like.

Illustrative examples of the benzophenone-based compound include 4,4'-bis(dimethylamino)benzophenone, 4,4'-bis(diethylamino)benzophenone and the like.

Illustrative examples of the α-diketone-based compound include diacetyl, dibenzoyl, methylbenzoyl formate and the like.

Illustrative examples of the polynuclear quinone-based compound include anthraquinone, 2-ethylanthraquinone, 2-t-butylanthraquinone, 1,4-naphthoquinone and the like.

Illustrative examples of the xanthone-based compound include xanthone, thioxanthone, 2-chlorothioxanthone and the like.

Illustrative examples of the triazine-based compound include 1,3,5-tris(trichloromethyl)-s-triazine, 1,3-bis(trichloromethyl)-5-(2'-chlorophenyl)-s-triazine, 1,3-bis(trichloromethyl)-5-(4'-chlorophenyl)-s-triazine, 1,3-bis(trichloromethyl)-5-(2'-methoxyphenyl)-s-triazine, 1,3-bis(trichloromethyl)-5-(4'-methoxyphenyl)-s-triazine, 2-(2'-furylethylidene)-4,6-bis(trichloromethyl)-s-triazine, 2-(4'-methoxystyryl)-4,6-bis(tridhloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(2'-bromo-4'-methylphenyl)-4,6-bis(trichloromethyl)-s-triazine, 2-(2'-thiophenylethylidene)-4,6-bis(trichloromethyl)-s-triazine and the like.

Of the above benzoin-based compounds, acetophenone-based compounds, benzophenone-based compounds, α-diketone-based compounds, polynuclear quinone-based compounds, xanthone-based compounds and triazine-based compounds (to be referred to as "benzoin-based compounds and the like" hereinafter), 2-hydroxy-2-methyl-1-phenylpropan-1-one, 2-methyl-(4-methylthiophenyl)-2-morpholino-1-propan-1-one and 2-benzyl-2-dimethylamino-1-(4-morpholinophenyl)butan-1-one are preferred because the formed pixel pattern hardly falls off from the substrate at the time of development and the pixel strength and sensitivity are high.

In the present invention, the compounds having a biimidazole ring and the like may be used alone or in combination of two or more.

In the present invention, the compound having a biimidazole ring or the like can be used in combination with at least one member selected from the group consisting of a sensitizer, a curing promoting agent and a photo-crosslinking agent or photosensitizer composed of a polymer compound as required (to be referred to as "polymer photo-crosslinking/sensitizing agent" hereinafter).

Illustrative examples of the sensitizer include 4,4'-bis(dimethylamino)benzophenone, 4,4'-bis(diethylamino)benzophenone, 4-diethylaminoacetophenone, 4-dimethylaminopropiophenone, ethyl-4-dimethylaminobenzoate, 2-ethylhexyl-1,4-dimethylaminobenzoate, 2,5-bis(4'-diethylaminobenzal)cyclohexanone, 7-diethylamino-3-( 4-diethylaminobenzoyl)coumarin, 4-(diethylamino)chalcone and the like.

Illustrative examples of the curing promoting agent include chain transfer agents such as 2-mercaptobenzoimidazole, 2-mercaptobenzothiazole, 2-mercaptobenzooxazole, 2,5-dimercapto-1,3,4-thiadiazole, 2-mercapto-4,6-dimethylaminopyridine, 1-phenyl-5-mercapto-1H-tetrazole, 3-mercapto-4-methyl-4H-1,2,4-triazole and the like.

Further, the polymer photo-crosslinking/sensitizing agent is a polymer compound having a functional group which can function as a photo-crosslinking agent and/or photosensitizing agent in the main chain and/or side chain. Illustrative examples of the polymer photo-crosslinking/sensitizing agent include a condensate of 4-azidobenzaldehyde and polyvinyl alcohol, condensate of 4- azidobenzaldehyde and phenol novolak resin, homopolymer and copolymer of 4-acryloylphenylcinnamoyl ester, 1,4-polybutadiene, 1,2-polybutadiene and the like.

Of the above sensitizers, curing promoting agents and polymer photo-crosslinking/sensitizing agents, 4,4'-bis(dimethylamino)benzophenone, 4,4'-bis(diethylamino)benzophenone and 2-mercaptobenzothiazole are preferred because the formed pixel pattern hardly falls off from the substrate at the time of development and the pixel strength and sensitivity are high.

In the present invention, the photopolymerization initiator is particularly preferably a combination of at least one selected from the group consisting of the biimidazole-based compounds (1) and the biimidazole-based compounds (2), and an acetophenone-based compound and/or a benzophenone-based compound.

Particularly preferred examples of the above combination include a combination of 2,2'-bis( 2-chlorophenyl)-4,4',5,5'-tetrakis(4-ethoxycarbonylphenyl)-1,2'-biimidazole/4,4'-bis(diethylamino)benzophenone; a combination of 2,2'-bis(2-chlorophenyl)-4,4',5,5'-tetrakis(4-ethoxycarbonylphenyl)-1,2'-biimidazole, 4,4'-bis(diethylamino)benzophenone/2-benzyl-2-dimethylamino-1-(4-morpholinophenyl)butan-1-one; a combination of 2,2'-bis(2-chlorophenyl)-4,4',5,5'-tetrakis(4-ethoxycarbonylphenyl)-1,2'-biimidazole/4,4'-bis(diethylamino)benzophenone/1-hydroxycyclohexylphenyl ketone; a combination of 2,2'-bis(2-chlorophenyl)-4,4',5,5'-tetrakis(4-ethoxycarbonylphenyl)-1,2'-biimidazole/4,4'-bis(dimethylamino)benzophenone/1-hydroxycyclohexylphenyl ketone/2-mercaptobenzothiazole; a combination of 2,2'-bis(2,4-dichlorophenyl)-4,4',5,5'-tetraphenyl-1,2'-biimidazole/4,4'-bis(diethylamino)benzophenone; a combination of 2,2'-bis(2,4-dibromophenyl)-4,4',5,5'-tetraphenylbi-1,2'-biimidazole/4,4'-bis(diethylamino)benzophenone/2-benzyl-2-dimethylamino-1-(4-morpholinophenyl)butan-1-one; a combination of 2,2'-bis(2,4-dibromophenyl)-4,4',5,5'-tetraphenylbi-1,2'-biimidazole/4,4'-bis(diethylamino)benzophenone/1-hydroxycyclohexylphenyl ketone; a combination of 2,2'-bis(2,4-dichlorophenyl)-4,4',5,5'-tetraphenyl-1,2'-biimidazole/4,4'-bis(diethylamino)benzophenone/2-benzyl-2-dimethylamino-1-(4-morpholinophenyl)butan-1-one/2-mercaptobenzothiazole; a combination of 2,2'-bis(2,4,6-trichlorophenyl)-4,4',5,5'-tetraphenyl-1,2'-biimidazole/4,4'-bis(dimethylamino)benzophenone/1-hydroxycyclohexylphenyl ketone/2-mercaptobenzothiazole; and a combination of 2,2'-bis(2,4-dichlorophenyl)-4,4',5,5'-tetraphenyl-1,2'-biimidazole/2-benzyl-2-dimethylamino-1-(4-morpholinophenyl)butan-1-one.

In the present invention, the total amount of the benzoin-based compound and the like is preferably 80 wt % or less based on the whole amount of the photopolymerization initiator, the total amount of the sensitizer and the curing promoting agent is preferably 80 wt % or less based on the whole amount of the photopolymerization initiator, and the amount of the polymer photo-crosslinking/sensitizing agent is generally 200 parts or less by weight, preferably 0.01 to 200 parts by weight, more preferably 50 to 180 parts by weight based on 100 parts by weight of the total of the bilmidazole-based compound (1) and the biimidazole-based compound (2).

The amount of the photopolymerization initiator in the present invention is generally 0.01 to 200 parts by weight, preferably 1 to 120 parts by weight, particularly preferably 1 to 50 parts by weight based on 100 parts by weight of the total of the components (C) and (D). When the amount of the photopolymerization initiator is smaller than 0.01 part by weight, curing by exposure is insufficient with the result that a pixel pattern may be partially or completely lost or undercut. On the other hand, when the amount is larger than 200 parts by weight, the formed pixel pattern easily falls off from the substrate at the time of development, and stains or film residues are readily produced in an area other than a portion where pixels are formed.

Additive

The radiation sensitive composition of the present invention may further contain various additives as required.

Illustrative examples of the additives include dispersion aids for blue pigment derivative exemplified by copper phthalocyanine derivative and yellow pigment derivative; fillers such as glass and alumina; polymer compounds such as polyvinyl alcohol, polyethylene glycol moloalkyl ether and poly(fluoroalkylacrylate); surfactants such as nonionic surfactant, cationic surfactant and anionic surfactant; bond promoting agents such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyl trimethoxysilane and 3-mercaptopropyltrimethoxysilane; antioxidants such as 2,2-thiobis(4-methyl-6-t-butylphenol) and 2,6-di-t-butylphenol; ultraviolet absorbers such as 2-(3-t-butyl-5-methyl-2-hydroxyphenyl)-5-chlorobenzotriazole and alkoxybenzophenone; and agglomeration inhibitors such as sodium polyacrylate.

Solvent

The radiation sensitive composition (including the first, second, third and fourth compositions) of the present invention comprises the above components (A), (B), (C), (D) and (E) as essential components and the above additive components as required. All the above components excluding the component (A) are generally dissolved in an appropriate solvent to prepare a liquid composition.

Any solvents are acceptable as long as they can disperse or dissolve and do not react with the components (A) to (E) and the additive components and have appropriate volatility.

Illustrative examples of the solvent include (poly) alkylene glycol monoalkyl ethers such as ethylene glycol monomethyl ether, ethylene glycol monoethyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether and tripropylene glycol monoethyl ether; (poly)alkylene glycol monoalkyl ether acetates such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate and propylene glycol monoethyl ether acetate; other ethers such as diethylene glycol dimethyl ether, diethylene glycol methyl ethyl ether, diethylene glycol diethyl ether and tetrahydrofuran; ketones such as methyl ethyl ketone, cyclohexanone, 2-heptanone and 3-heptanone; alkyl lactates such as methyl 2-hydroxypropionate and ethyl 2-hydroxypropionate; other esters such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutyrate, 3-methyl-3-methoxybutyl acetate, 3-methyl-3-methoxybutyl propionate, ethyl acetate, n-propyl acetate, i-propyl acetate, n-butyl acetate, i-butyl acetate, n-amyl acetate, i-amyl acetate, n-butyl propionate, ethyl butyrate, n-propyl butyrate, i-propyl butyrate, n-butyl butyrate, methylpyruvic acid, ethylpyruvic acid, n-propylpyruvic acid, methyl acetoacetate, ethyl acetoacetate and ethyl 2-oxobutyrate; aromatic hydrocarbons such as toluene and xylene; carboxylic acid amides such as N-methylpyrrolidone, N,N-dimethylformamide, and N,N-dimethylacetoamide; and the like.

These solvents may be used alone or in admixture of two or more.

A high-boiling solvent such as benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and ethylene glycol monophenyl ether acetate can be used in combination with the solvent.

These high-boiling solvents may be used alone or in admixture of two or more.

Of the above solvents, ethylene glycol monomethyl ether acetate, propylene glycol monomethyl ether acetate, propylene glycol monoethyl ether acetate, diethylene glycol dimethyl ether, cyclohexanone, 2-heptanone, 3-heptanone, ethyl 2-hydroxypropionate, 3-methyl-3-methoxybutyl propionate, ethyl 3-methoxypropionate, methyl 3-ethoxypropionate, ethyl 3-ethoxypropionate, n-butyl acetate, i-butyl acetate, n-amyl acetate, i-amyl acetate, n-butyl propionate, ethyl butyrate, i-propyl butyrate, n-butyl butyrate and ethylpyruvic acid are preferred from the viewpoint of solubility, pigment dispersibility and coating properties, and of the above high-boiling solvents, γ-butyrolactone is preferred.

The amount of the solvent in the present invention is generally 100 to 10,000 parts by weight, preferably 500 to 5,000 parts by weight based on 100 parts by weight of the binder polymer (B).

Method of Forming a Color Filter

A description is subsequently given of a method of forming a color filter using the radiation sensitive composition of the present invention.

A light screening layer is first formed to define a portion for forming pixels on the surface of a transparent substrate. A liquid radiation sensitive composition having, for example, a red pigment dispersed therein is coated on this substrate and the coated substrate is prebaked to evaporate the solvent so as to form a coating film. Thereafter, the coating film is exposed to radiation through a photomask and developed with an alkali developer to dissolve and remove unexposed portions of the coating film and then preferably further post-baked to form an array of red pixels arranged in a predetermined pattern.

Thereafter, liquid radiation sensitive compositions having green and blue pigments dispersed therein are coated, prebaked, exposed and developed and preferably further post-baked in the same manner as described above to form arrays of green pixels and blue pixels on the same substrate sequentially. Thus, a color filter having arrays of three red, green and blue pixels arranged on the substrate is obtained.

The transparent substrate used to form the color filter is made from glass, silicon, polycarbonate, polyester, aromatic polyamide, polyamideimide, polyimide or the like. The transparent substrate can be subjected to a suitable pretreatment such as chemical treatment with a silane coupling agent or the like, plasma treatment, ion plating, sputtering, gas vapor reaction process or vacuum vapor deposition.

To coat the liquid radiation sensitive composition on the transparent substrate, rotation coating, cast coating, roll coating or the like can be suitably employed.

The thickness of the coating film after drying is generally 0.1 to 10 µm, preferably 0.2 to 5.0 µm, particularly preferably 0.2 to 3.0 µm.

The radiation used to form a color filter is selected from visible light, ultraviolet light, far ultraviolet light, electron beams, X-rays and the like. It preferably has a wavelength of 190 to 450 nm.

The irradiation energy of the radiation is preferably 1 to 1,000 mJ/cm$^2$.

The alkali developer is preferably an aqueous solution of sodium carbonate, sodium hydroxide, potassium hydroxide, tetramethyl ammonium hydroxide, choline, 1,8-diazabicyclo-[5.4.0]-7-undecene, 1,5-diazabicyclo-[4.3.0]-5-nonene or the like.

The alkali developer may contain a water-soluble organic solvent such as methanol or ethanol and a surfactant in suitable amounts. The alkali developer is generally washed off with water.

Development is carried out by shower development, spray development, dip development, puddle development or the like at normal temperature for 5 to 300 seconds.

The thus formed color filter is extremely useful for color liquid crystal display devices, color image pick-up elements, color sensors and the like.

The following examples are provided for the purpose of further illustrating the present invention but are in no way to be taken as limiting.

COMPARATIVE EXAMPLE 1

A liquid radiation sensitive composition was prepared by mixing 80 parts by weight of a mixture of C.I. Pigment Yellow 83 and C.I. Pigment Green 36 in a weight ratio of 17/83 as the component (A), 50 parts by weight of a copolymer of methacrylic acid/2-hydroxyethyl methacrylate/benzyl methacrylate/polystyrene macromonomer (weight ratio of 60/15/15/10, weight average molecular weight=25,000) as the component (B), 40 parts by weight of dipentaerythritol pentaacrylate as the component (C), 10 parts by weight of 2,2'-bis(2,4-dichlorophenyl)-4,4',5,5'-tetraphenyl-1,2'-biimidazole, 10 parts by weight of 4,4'-bis (diethylamino)benzophenone, 30 parts by weight of 2-benzyl-2-dimethylamino-1-(4-morpholinophenyl)butan-1-one and 5 parts by weight of 2-mercaptobenzothiazole as the components (E), and 1,500 parts by weight of ethyl 3-ethoxypropionate as a solvent.

A light screening layer for defining a portion for forming pixels was formed on the surface of a soda-glass transparent substrate having a silica (SiO$_2$) film for preventing the elution of sodium ions formed on the surface, and this liquid composition was coated with a spin coater and prebaked at 90° C. for 2 minutes to form a 2.0-µm-thick coating film.

Thereafter, the substrate was cooled to room temperature and exposed to 100 mJ/cm$^2$ of ultraviolet light having a wavelength of 365 nm, 405 nm and 436 nm through a photomask and using a high-pressure mercury lamp. The substrate was then immersed in a 0.04 wt % aqueous solution of potassium hydroxide heated at 23° C. for 1 minute to be developed, washed with ultra-purified water and dried with air. The substrate was further post-baked at 180° C. for 30 minutes to produce a pixel array having a 20 µm×20 µm green pixel pattern formed on the transparent substrate.

When this pixel array was observed through an optical microscope, a partial or complete loss of the pixel pattern was seen, an undissolved product (residue) of the composition remained in unexposed portions, scum was seen on the pixels and the adhesion of the obtained pixels to the substrate was insufficient.

EXAMPLE 1

A liquid composition was prepared by mixing 80 parts by weight of a mixture of C.I. Pigment Yellow 83 and C.I. Pigment Green 36 in a weight ratio of 17/83 as the component (A), 50 parts by weight of a copolymer of methacrylic acid/2-hydroxyethyl methacrylate/benzyl methacrylate/polystyrene macromonomer (weight ratio of 60/15/15/10, weight average molecular weight=25,000) as the component (B), 40 parts by weight of dipentaerythritol pentaacrylate as the component (C), 5 parts by weight of ω-carboxy-polycaprolactone monoacrylate as the component (D), 10 parts by weight of 2,2'-bis(2,4-dichlorophenyl)-4,4',5,5'-tetraphenyl-1,2'-biimidazole, 10 parts by weight of 4,4'-bis (diethylamino)benzophenone, 30 parts by weight of 2-benzyl-2-dimethylamino-1-(4-morpholinophenyl)butan-1-one and 5 parts by weight of 2-mercaptobenzothiazole as the components (E) and 1,500 parts by weight of ethyl 3-ethoxypropionate as a solvent.

A light screening layer for defining a portion for forming pixels was formed on the surface of a soda-glass transparent substrate having a silica (SiO$_2$) film for preventing the elution of sodium ions formed on the surface, and this liquid composition was coated with a spin coater and prebaked at 90° C. for 2 minutes to form a 2.0-µm-thick coating film.

Thereafter, the substrate was cooled to room temperature and exposed to 100 mJ/cm$^2$ of ultraviolet light having a wavelength of 365 nm, 405 nm and 436 nm through a photomask and using a high-pressure mercury lamp. The substrate was then immersed in a 0.04 wt % aqueous solution of potassium hydroxide heated at 23° C. for 1 minute to be developed, washed with ultra-purified water and dried with air. The substrate was further post-baked at 180° C. for 30 minutes to produce a pixel array having a 20 µm×20 µm green pixel pattern formed on the transparent substrate.

When this pixel array was observed through an optical microscope, no partial or complete loss of the pixel pattern was seen, no undissolved product (residue) of the composition remained in unexposed portions, no scum was seen on the pixels and the adhesion of the obtained pixels to the substrate was excellent.

COMPARATIVE EXAMPLE 2

A liquid composition was prepared by mixing 80 parts by weight of a mixture of C.I. Pigment Yellow 83 and C.I. Pigment Green 36 in a weight ratio of 17/83 as the component (A), 50 parts by weight of a copolymer of methacrylic acid/2-hydroxyethyl methacrylate/benzyl methacrylate (weight ratio of 70/15/15, weight average molecular weight=25,000) as the component (B), 40 parts by weight of dipentaerythritol pentaacrylate as the component (C), 10 parts by weight of 2,2'-bis(2,4-dichlorophenyl)-4,4',5,5'-tetraphenyl-1,2'-biimidazole and 30 parts by weight of 2-benzyl-2-dimethylamino-1-(4-morpholinophenyl)butan- 1-one as the components (E), 10 parts by weight of 4,4'-bis(diethylamino)benzophenone as a sensitizer, 5 parts by weight of 2-mercaptobenzothiazole as a curing promoting agent and 1,500 parts by weight of ethyl 3-ethoxypropionate as a solvent.

A light screening layer for defining a portion for forming pixels was formed on the surface of a soda-glass transparent substrate having a silica ($SiO_2$) film for preventing the elution of sodium ions formed on the surface, and this liquid composition was coated with a spin coater and prebaked at 90° C. for 2 minutes to form a 2.0-$\mu$m-thick coating film.

Thereafter, the substrate was cooled to room temperature and exposed to 100 mJ of ultraviolet light having a wavelength of 365 nm, 405 nm and 436 nm through a photomask and using a high-pressure mercury lamp. The substrate was then immersed in a 0.04 wt % aqueous solution of potassium hydroxide heated at 23° C. for 1 minute to be developed, washed with ultra-purified water and dried with air. The substrate was further post-baked at 180° C. for 30 minutes to produce a pixel array having a 20 $\mu$m×20 $\mu$m green pixel pattern.

When this pixel array was observed through an optical microscope, a partial or complete loss of the pixel pattern was seen, an undissolved product (residue) of the composition remained in unexposed portions and scum was seen on the pixels.

EXAMPLE 2

A liquid composition was prepared by mixing 80 parts by weight of a mixture of C.I. Pigment Yellow 83 and C.I. Pigment Green 36 in a weight ratio of 17/83 as the component (A), 50 parts by weight of a copolymer of methacrylic acid/2-hydroxyethyl methacrylate/benzyl methacrylate (weight ratio of 70/15/15, weight average molecular weight=25,000) as the component (B), 40 parts by weight of dipentaerythritol pentaacrylate as the component (C), 5 parts by weight of methacrylamide as the component (D), 10 parts by weight of 2,2'-bis( 2,4-dichlorophenyl)-4,4',5,5¹-tetraphenyl-1,2'-biimidazole and 30 parts by weight of 2-benzyl-2-dimethylamino-1-(4-morpholinophenyl)butan-1-one as the components (E), 10 parts by weight of 4,4'-bis(diethylamino)benzophenone as a sensitizer, 5 parts by weight of 2-mercaptobenzothiazole as a curing promoting agent and 1,500 parts by weight of ethyl 3-ethoxypropionate as a solvent.

A light screening layer for defining a portion for forming pixels was formed on the surface of a soda-glass transparent substrate having a silica ($SiO_2$) film for preventing the elution of sodium ions formed on the surface, and this liquid composition was coated with a spin coater and prebaked at 90° C. for 2 minutes to form a 2.0-$\mu$m-thick coating film.

Thereafter, the substrate was cooled to room temperature and exposed to 100 mJ of ultraviolet light having a wavelength of 365 nm, 405 nm and 436 nm through a photomask and using a high-pressure mercury lamp. The substrate was then immersed in a 0.04 wt % aqueous solution of potassium hydroxide heated at 23° C. for 1 minute to be developed, washed with ultra-purified water and dried with air. The substrate was further post-baked at 180° C. for 30 minutes to produce a pixel array having a 20 $\mu$m×20 $\mu$m green pixel pattern.

When this pixel array was observed through an optical microscope, no partial or complete loss of the pixel pattern was seen, no undissolved product (residue) of the composition remained in unexposed portions, no scum was seen on the pixels and the adhesion of the obtained pixels to the substrate was excellent.

COMPARATIVE EXAMPLE 3

A liquid composition was prepared by mixing 80 parts by weight of a mixture of C.I. Pigment Yellow 83 and C.I. Pigment Green 36 in a weight ratio of 17/83 as the component (A), 50 parts by weight of a copolymer of methacrylic acid/2-hydroxyethyl methacrylate/benzyl methacrylate/polystyrene macromonomer (weight ratio of 60/15/15/10, weight average molecular weight=25,000) as the component (B), 40 parts by weight of dipentaerythritol pentaacrylate as the component (C), 10 parts by weight of 2,2'-bis(2,4-dichlorophenyl)-4,4',5,5'-tetraphenyl-1,2'-biimidazole, 10 parts by weight of 4,4'-bis(diethylamino)benzophenone, 30 parts by weight of 2-benzyl-2-dimethylamino-1-(4-morpholinophenyl)butan-1-one and 5 parts by weight of 2-mercaptobenzothiazole as the components (E) and 1,500 parts by weight of ethyl 3-ethoxypropionate as a solvent.

A light screening layer for defining a portion for forming pixels was formed on the surface of a soda-glass transparent substrate having a silica ($SiO_2$) film for preventing the elution of sodium ions formed on the surface, and this liquid composition was coated with a spin coater and prebaked at 90° C. for 2 minutes to form a 2.0-$\mu$m-thick coating film.

Thereafter, the substrate was cooled to room temperature and exposed to 100 mJ/cm$^2$ of ultraviolet light having a wavelength of 365 nm, 405 nm and 436 nm through a photomask and using a high-pressure mercury lamp. The substrate was then immersed in a 0.04 wt % aqueous solution of potassium hydroxide heated at 23° C. for 1 minute to be developed, washed with ultra-purified water and dried with air. The substrate was further post-baked baked at 180° C. for 30 minutes to produce a pixel array having a 20 $\mu$m×20 $\mu$m green pixel pattern formed on the transparent substrate.

When this pixel array was observed through an optical microscope, a partial or complete loss of the pixel pattern was seen, an undissolved product (residue) of the composition remained in unexposed portions, scum was seen on the pixels and the adhesion of the obtained pixels to the substrate was insufficient.

EXAMPLE 3

A liquid composition was prepared by mixing 80 parts 10 by weight of a mixture of C.I. Pigment Yellow 83 and C.I. Pigment Green 36 in a weight ratio of 17/83 as the component (A), 50 parts by weight of a copolymer of methacrylic acid/2-hydroxyethyl methacrylate/benzyl methacrylate/polystyrene macromonomer (weight ratio of 60/15/15/10, weight average molecular weight=25,000) as the component (B), 40 parts by weight of dipentaerythritol pentaacrylate as the component (C), 5 parts by weight of a compound represented by the above structural formula (1-9) as the component (D), 10 parts by weight of 2,2'-bis(2,4-dichlorophenyl)-4,4',5,5'-tetraphenyl-1,2'-bimidazole, 10 parts by weight of 4,4'-bis(diethylamino)benzophenone, 30 parts by weight of 2-benzyl-2-dimethylamino-1-(4-morpholinophenyl)butan-1-one and 5 parts by weight of 2-mercaptobenzothiazole as the components (E) and 1,500 parts by weight of ethyl 3-ethoxypropionate as a solvent.

A light screening layer for defining a portion for forming pixels was formed on the surface of a soda-glass transparent substrate having a silica ($SiO_2$) film for preventing the elution of sodium ions formed on the surface, and this liquid composition was coated with a spin coater and prebaked at 90° C. for 2 minutes to form a 2.0-$\mu$m-thick coating film.

Thereafter, the substrate was cooled to room temperature and exposed to 100 mJ/cm$^2$ of ultraviolet light having a wavelength of 365 nm, 405 nm and 436 nm through a photomask and using a high-pressure mercury lamp. The substrate was then immersed in a 0.04 wt % aqueous solution of potassium hydroxide heated at 23° C. for 1 minute to be developed, washed with ultra-purified water and dried with air. The substrate was further post-baked at 180° C. for 30 minutes to produce a pixel array having a 20 µm×20 µm green pixel pattern formed on the transparent substrate.

When this pixel array was observed through an optical microscope, no partial or complete loss of the pixel pattern was seen, no undissolved product (residue) of the composition remained in unexposed portions, no scum was seen on the pixels and the adhesion of the obtained pixels to the substrate was excellent.

COMPARATIVE EXAMPLE 4

A liquid composition was prepared by mixing 80 parts by weight of a mixture of C.I. Pigment Yellow 83 and C.I. Pigment Green 36 in a weight ratio of 17/83 as the component (A), 50 parts by weight of a copolymer of methacrylic acid/2-hydroxyethyl methacrylate/benzyl methacrylate/polystyrene macromonomer (weight ratio of 60/15/15/10, weight average molecular weight=25,000) as the component (B), 40 parts by weight of dipentaerythritol pentaacrylate as the component (C), 10 parts by weight of 2,2'-bis(2,4-dichlorophenyl)-4,4',5,5'-tetraphenyl-1,2'-biimidazole, 10 parts by weight of 4,4'-bis(diethylamino)benzophenone, 30 parts by weight of 2-benzyl-2-dimethylamino-1-(4-morpholinophenyl)butan-1-one and 5 parts by weight of 2-mercaptobenzothiazole as the components (E) and 1,500 parts by weight of ethyl 3-ethoxypropionate as a solvent.

A light screening layer for defining a portion for forming pixels was formed on the surface of a soda-glass transparent substrate having a silica ($SiO_2$) film for preventing the elution of sodium ions formed on the surface, and this liquid composition was coated with a spin coater and prebaked at 90° C. for 2 minutes to form a 2.0-µm-thick coating film.

Thereafter, the substrate was cooled to room temperature and exposed to 100 mJ/cm² of ultraviolet light having a wavelength of 365 nm, 405 nm and 436 nm through a photomask and using a high-pressure mercury lamp. The substrate was then immersed in a 0.04 wt % aqueous solution of potassium hydroxide heated at 23° C. for 1 minute to be developed, washed with ultra-purified water and dried with air. The substrate was further post-baked at 180° C. for 30 minutes to produce a pixel array having a 20 µm×20 µm green pixel pattern formed on the transparent substrate.

When this pixel array was observed through an optical microscope, a partial or complete loss of the pixel pattern was seen, an undissolved product (residue) of the composition remained in unexposed portions, scum was seen on the pixels and the adhesion of the obtained pixels to the substrate was insufficient.

EXAMPLE 4

A liquid composition was prepared by mixing 80 parts by weight of a mixture of C.I. Pigment Yellow 83 and C.I. Pigment Green 36 in a weight ratio of 17/83 as the component (A), 50 parts by weight of a copolymer of methacrylic acid/2-hydroxyethyl methacrylate/benzyl methacrylate/polystyrene macromonomer (weight ratio of 60/15/15/10, weight average molecular weight=25,000) as the component (B), 40 parts by weight of dipentaerythritol pentaacrylate as the component (C), 5 parts by weight of Light Ester BP-2EM as the component (D), 10 parts by weight of 2,2'-bis(2,4-dichlorophenyl)-4,4',5,5'-tetraphenyl-1,2'-biimidazole, 10 parts by weight of 4,4'-bis(diethylamino)benzophenone, 30 parts by weight of 2-benzyl-2-dimethylamino-1-(4-morpholinophenyl)butan-1-one and 5 parts by weight of 2-mercaptobenzothiazole as the components (E) and 1,500 parts by weight of ethyl 3-ethoxypropionate as a solvent.

A light screening layer for defining a portion for forming pixels was formed on the surface of a soda-glass transparent substrate having a silica ($SiO_2$) film for preventing the elution of sodium ions formed on the surface, and this liquid composition was coated with a spin coater and prebaked at 90° C. for 2 minutes to form a 2.0-µm-thick coating film.

Thereafter, the substrate was cooled to room temperature and exposed to 100 mJ/cm² of ultraviolet light having a wavelength of 365 nm, 405 nm and 436 nm through a photomask and using a high-pressure mercury lamp. The substrate was then immersed in a 0.04 wt % aqueous solution of potassium hydroxide heated at 23° C. for 1 minute to be developed, washed with ultra-purified water and dried with air. The substrate was further post-baked at 180° C. for 30 minutes to produce a pixel array having a 20 µm×20 µm green pixel pattern formed on the transparent substrate.

When this pixel array was observed through an optical microscope, no partial or complete loss of the pixel pattern was seen, no undissolved product (residue) of the composition remained in unexposed portions, no scum was seen on the pixels and the adhesion of the obtained pixels to the substrate was excellent.

What is claimed is:

1. A radiation sensitive composition comprising:

(A) a colorant;

(B) a binder polymer;

(C) a polyfunctional monomer;

(D2) an amide group-containing monoethylenically unsaturated monomer; and (E) a photopolymerization initiator;

wherein the binder polymer (B) is a copolymer of an ethylenically unsaturated monomer having a carboxyl group and an ethylenically unsaturated monomer copolymerizable with the monomer and having no carboxyl group.

2. The radiation sensitive composition of claim 1, wherein the colorant (A) is selected from the group consisting of an organic colorant and carbon black.

3. The radiation sensitive composition of claim 1, wherein the polyfunctional monomer (C) has at least two polymerizable ethylenically unsaturated bonds in the molecule.

4. The radiation sensitive composition of claim 1, wherein the polyfunctional monomer (C) is at least one member selected from the group consisting of trimethylolpropane triacrylate, trimethylolpropane trimethacrylate, pentaerythritol triacrylate, pentaerythritol trimethacrylate, dipentaerythritol pentaacrylate, dipentaerythritol pentamethacrylate, dipentaerythritol hexaacrylate and dipentaerythritol hexamethacrylate.

5. The radiation sensitive composition of claim 1, wherein the amide group-containing monoethylenically unsaturated monomer (D2) is at least one compound selected from the group consisting of (meth)acrylamide, N-methylol (meth)acrylamide, N,N-dimethyl (meth)acrylamide and N,N-(3-dimethylaminopropyl) (meth)acrylamide.

6. The radiation sensitive composition of claim 1, which comprises the binder polymer (B) in an amount of 10 to 1,000 parts by weight based on 100 parts by weight of the colorant (A), the polyfunctional monomer (C) in an amount of 5 to 500 parts by weight based on 100 parts by weight of the binder polymer (B), the amide group-containing monoethylenically unsaturated monomer (D2) in an amount of 0.1 to 50 parts by weight based on 100 parts by weight of the binder polymer (B), and the photopolymerization initiator (E) in an amount of 0.01 to 200 parts by weight based on 100 parts by weight of the total of the polyfunctional monomer (C) and the amide group-containing monoethylenically unsaturated monomer (D2).

7. A radiation sensitive composition comprising:

(A) a colorant;

(B) a binder polymer;

(C) a polyfunctional monomer;

(D3) a monoethylenically unsaturated monomer having a cyclic amide group or a cyclic imide group; and (E) a photopolymerization initiator.

8. The radiation sensitive composition of claim 7, wherein the colorant (A) is selected from the group consisting of an organic colorant and carbon black.

9. The radiation sensitive composition of claim 7, wherein the binder polymer (B) is a copolymer of an ethylenically unsaturated monomer having a carboxyl group and an ethylenically unsaturated monomer copolymerizable with the monomer and having no carboxyl group.

10. The radiation sensitive composition of claim 7, wherein the polyfunctional monomer (C) has at least two polymerizable ethylenically unsaturated bonds in the molecule.

11. The radiation sensitive composition of claim 7, wherein the polyfunctional monomer (C) is at least one member selected from the group consisting of trimethylolpropane triacrylate, trimethylolpropane trimethacrylate, pentaerythritol triacrylate, pentaerythritol trimethacrylate, dipentaerythritol pentaacrylate, dipentaerythritol pentamethacrylate, dipentaerythritol hexaacrylate and dipentaerythritol hexamethacrylate.

12. The radiation sensitive composition of claim 7, wherein the monoethylenically unsaturated monomer (D3) having a cyclic amide group or cyclic imide group is represented by the following formula (1):

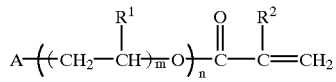

(1)

wherein A is a group having a cyclic imide group or cyclic amide group, the bond from A being the bond from the nitrogen atom of the cyclic imide group or cyclic amide group, $R^1$ and $R^2$ are independently a hydrogen atom or methyl group, and m and n are independently an integer of 1 to 3.

13. The radiation sensitive composition of claim 12, wherein the compound represented by formula (1) is at least one compound selected from the group consisting of compounds represented by formulas (1-1) to (1-40):

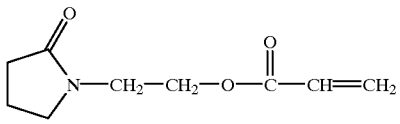

(1-1)

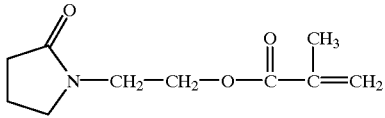

(1-2)

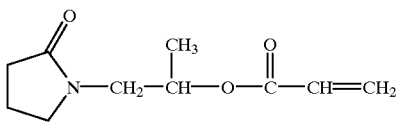

(1-3)

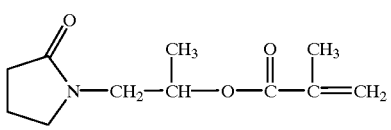

(1-4)

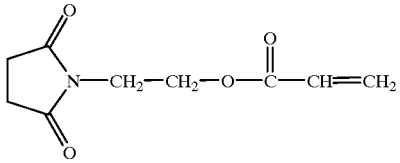

(1-5)

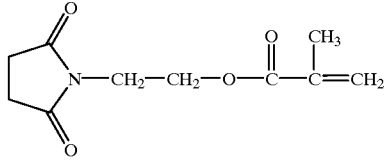

(1-6)

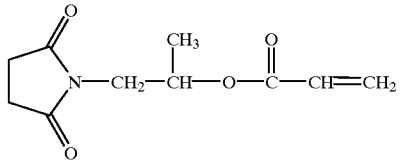

(1-7)

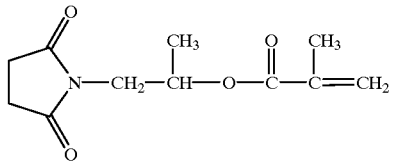

(1-8)

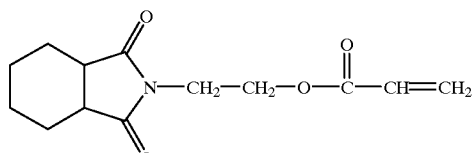

(1-9)

-continued (1-10)

(1-11)

(1-12)

(1-13)

(1-14)

(1-15)

(1-16)

(1-17)

-continued (1-18)

(1-19)

(1-20)

(1-21)

(1-22)

(1-23)

(1-24)

(1-25)

(1-26)

(1-27)
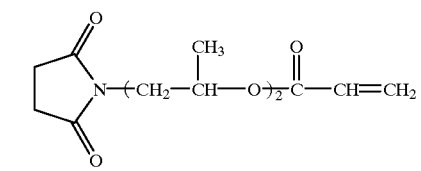

(1-28)
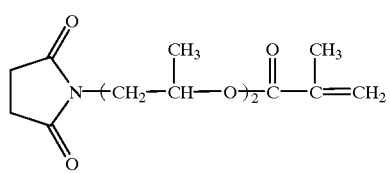

(1-29)
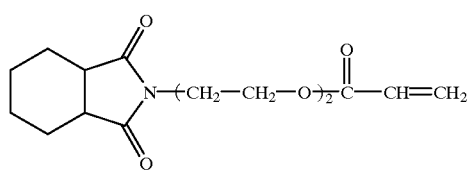

(1-30)
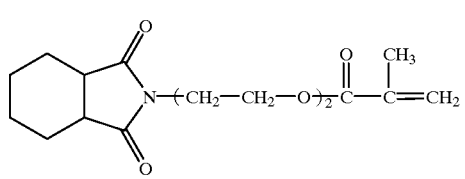

(1-31)
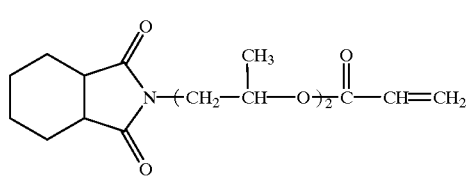

(1-32)
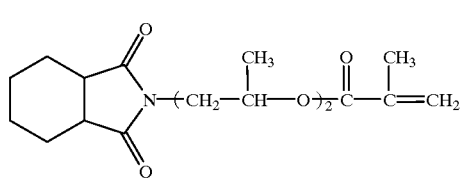

(1-33)
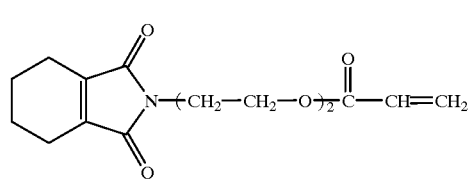

(1-34)
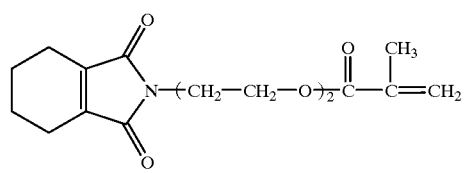

(1-35)
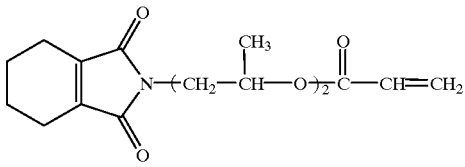

(1-36)
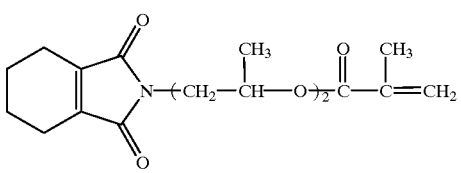

(1-37)
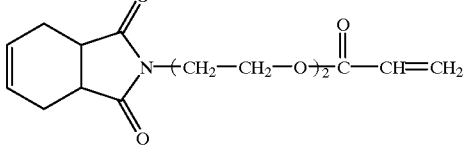

(1-38)
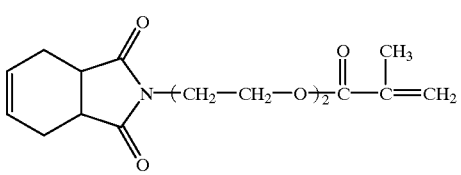

(1-39)
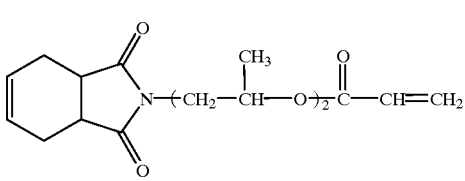

(1-40)
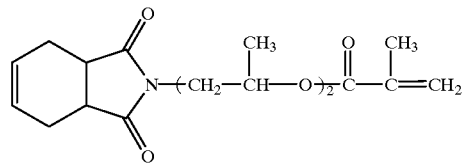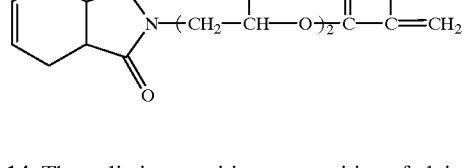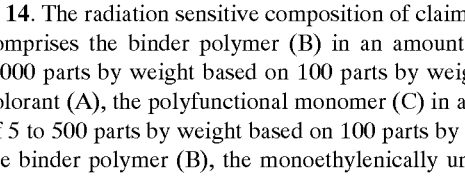

14. The radiation sensitive composition of claim 7, which comprises the binder polymer (B) in an amount of 10 to 1,000 parts by weight based on 100 parts by weight of the colorant (A), the polyfunctional monomer (C) in an amount of 5 to 500 parts by weight based on 100 parts by weight of the binder polymer (B), the monoethylenically unsaturated monomer having a cyclic imide group or cyclic amide group (D3) in an amount of 1 to 90 parts by weight based on 100 parts by weight of the total of the polyfunctional monomer (C) and the monoethylenically unsaturated monomer having a cyclic imide group or cyclic amide group (D3), and the photopolymerization initiator (E) in an amount of 0.01 to 200 parts by weight based on 100 parts by weight of the total of the polyfunctional monomer (C) and the monoethylenically unsaturated monomer having a cyclic imide group or cyclic amide group (D3).

* * * * *